(12) United States Patent
Dimitrov et al.

(10) Patent No.: US 9,529,115 B2
(45) Date of Patent: Dec. 27, 2016

(54) GEOPHYSICAL MODELING OF SUBSURFACE VOLUMES BASED ON HORIZON EXTRACTION

(71) Applicants: Pavel Dimitrov, Houston, TX (US); Matthias Imhof, Katy, TX (US)

(72) Inventors: Pavel Dimitrov, Houston, TX (US); Matthias Imhof, Katy, TX (US)

(73) Assignee: ExxonMobil Upstream Research Company, Houston, TX (US)

(*) Notice: Subject to any disclaimer, the term of this patent is extended or adjusted under 35 U.S.C. 154(b) by 0 days.

(21) Appl. No.: 14/649,857

(22) PCT Filed: Nov. 18, 2013

(86) PCT No.: PCT/US2013/070531
§ 371 (c)(1),
(2) Date: Jun. 4, 2015

(87) PCT Pub. No.: WO2014/099201
PCT Pub. Date: Jun. 26, 2014

(65) Prior Publication Data
US 2015/0301225 A1   Oct. 22, 2015

Related U.S. Application Data

(60) Provisional application No. 61/740,354, filed on Dec. 20, 2012.

(51) Int. Cl.
*G06G 7/48* (2006.01)
*G01V 99/00* (2009.01)
(Continued)

(52) U.S. Cl.
CPC ............. *G01V 99/005* (2013.01); *G01V 1/301* (2013.01); *G06F 17/5009* (2013.01)

(58) Field of Classification Search
CPC .... G01V 1/301; G01V 99/005; G06F 17/5009
(Continued)

(56) References Cited

U.S. PATENT DOCUMENTS 5,319,554 A   6/1994 Padhi
5,416,750 A   5/1995 Doyen et al.
(Continued)

FOREIGN PATENT DOCUMENTS

WO   WO 99/64896   12/1999
WO   WO 2007/061744   5/2007
(Continued)

OTHER PUBLICATIONS

Famel, S. (2002), "Applications f plane-wave destruction filters," *Geophysics* 67, pp. 1946-1960.
(Continued)

*Primary Examiner* — Dwin M Craig
*Assistant Examiner* — Juan Ochoa
(74) *Attorney, Agent, or Firm* — ExxonMobil Upstream Research-Law Department

(57) ABSTRACT

Method and system is described for modeling one or more geophysical properties of a subsurface volume. The method includes extracting locations from the data volume and combining them into an object, for example a horizon. The extraction may begin with selecting one or more initial traces, assigning labels to each sample of each trace, selecting a propagation pattern, and propagating the labels from the initial traces along a vector volume. Then, locations with the same label are extracted (1106). As an alternative to label propagation, a specific type of labeled volume (1102) may be obtained, such as a stack of surfaces (1132). The object may then be further modified or utilized to enhance the process of producing hydrocarbons.

7 Claims, 13 Drawing Sheets

(51) Int. Cl.
*G01V 1/30* (2006.01)
*G06F 17/50* (2006.01)

(58) Field of Classification Search
USPC .......................................................... 703/10
See application file for complete search history.

(56) References Cited

U.S. PATENT DOCUMENTS

| | | | |
|---|---|---|---|
| 5,444,619 A | 8/1995 | Hoskins et al. | |
| 5,539,704 A | 7/1996 | Doyen et al. | |
| 5,586,082 A | 12/1996 | Anderson et al. | |
| 5,677,893 A | 10/1997 | de Hoop et al. | |
| 5,724,309 A | 3/1998 | Higgs et al. | |
| 5,838,634 A | 11/1998 | Jones et al. | |
| 5,852,588 A | 12/1998 | de Hoop et al. | |
| 5,920,319 A | 7/1999 | Vining et al. | |
| 5,940,777 A | 8/1999 | Keskes | |
| 6,052,650 A | 4/2000 | Assa et al. | |
| 6,226,596 B1 | 5/2001 | Gao | |
| 6,236,942 B1 | 5/2001 | Bush | |
| 6,295,504 B1 | 9/2001 | Ye et al. | |
| 6,411,903 B2 | 6/2002 | Bush | |
| 6,574,565 B1 | 6/2003 | Bush | |
| 6,618,678 B1 | 9/2003 | Van Riel | |
| 6,625,541 B1 | 9/2003 | Shenoy et al. | |
| 6,708,118 B2* | 3/2004 | Stark | G01V 1/30 702/16 |
| 6,725,163 B1 | 4/2004 | Trappe et al. | |
| 6,735,526 B1 | 5/2004 | Meldahl et al. | |
| 6,754,380 B1 | 6/2004 | Suzuki et al. | |
| 6,754,589 B2 | 6/2004 | Bush | |
| 6,757,614 B2 | 6/2004 | Pepper et al. | |
| 6,771,800 B2 | 8/2004 | Keskes et al. | |
| 6,801,858 B2 | 10/2004 | Nivlet et al. | |
| 6,804,609 B1 | 10/2004 | Brumbaugh | |
| 6,847,895 B2 | 1/2005 | Nivlet et al. | |
| 6,850,845 B2* | 2/2005 | Stark | G01V 1/30 702/16 |
| 6,853,922 B2* | 2/2005 | Stark | G01V 1/28 702/14 |
| 6,882,997 B1 | 4/2005 | Zhang et al. | |
| 6,941,228 B2 | 9/2005 | Toelle | |
| 6,950,786 B1 | 9/2005 | Sonneland et al. | |
| 6,957,146 B1 | 10/2005 | Taner et al. | |
| 6,970,397 B2 | 11/2005 | Castagna et al. | |
| 6,988,038 B2 | 1/2006 | Trappe et al. | |
| 7,006,085 B1 | 2/2006 | Acosta et al. | |
| 7,043,366 B2* | 5/2006 | McDermott | G01V 7/00 702/14 |
| 7,092,824 B2 | 8/2006 | Favret et al. | |
| 7,098,908 B2 | 8/2006 | Acosta et al. | |
| 7,206,782 B1 | 4/2007 | Padgett | |
| 7,222,023 B2 | 5/2007 | Laurenet et al. | |
| 7,243,029 B2 | 7/2007 | Lichman et al. | |
| 7,248,258 B2 | 7/2007 | Acosta et al. | |
| 7,248,539 B2 | 7/2007 | Borgos et al. | |
| 7,266,041 B1 | 9/2007 | Padgett | |
| 7,295,930 B2 | 11/2007 | Dulac et al. | |
| 7,308,139 B2 | 12/2007 | Wentland et al. | |
| 7,453,766 B1 | 11/2008 | Padgett | |
| 7,453,767 B1 | 11/2008 | Padgett | |
| 7,454,292 B2 | 11/2008 | Wang et al. | |
| 7,463,552 B1 | 12/2008 | Padgett | |
| 7,502,026 B2 | 3/2009 | Acosta et al. | |
| 7,697,373 B1 | 4/2010 | Padgett | |
| 7,769,546 B2 | 8/2010 | Lomask et al. | |
| 7,881,501 B2 | 2/2011 | Pinnegar et al. | |
| 7,912,649 B2* | 3/2011 | Harris | G01V 3/083 367/14 |
| 8,010,294 B2* | 8/2011 | Dorn | G01V 1/30 702/14 |
| 8,027,517 B2 | 9/2011 | Gauthier et al. | |
| 8,055,026 B2 | 11/2011 | Pedersen | |
| 8,065,088 B2* | 11/2011 | Dorn | G01V 1/30 702/14 |
| 8,121,969 B2 | 2/2012 | Chan et al. | |
| 8,219,322 B2 | 7/2012 | Monsen et al. | |
| 8,326,542 B2 | 12/2012 | Chevion et al. | |
| 8,346,695 B2 | 1/2013 | Peper et al. | |
| 8,358,561 B2 | 1/2013 | Kelly et al. | |
| 8,363,959 B2 | 1/2013 | Boiman et al. | |
| 8,380,435 B2 | 2/2013 | Kumaran et al. | |
| 8,385,603 B2* | 2/2013 | Beucher | G01V 1/32 382/109 |
| 8,447,524 B2* | 5/2013 | Chen | G01V 1/32 702/13 |
| 8,463,551 B2 | 6/2013 | Aarre | |
| 8,504,300 B2* | 8/2013 | Dorn | G01V 1/30 702/14 |
| 8,625,885 B2 | 1/2014 | Brinson, Jr. et al. | |
| 8,803,878 B2 | 8/2014 | Andersen et al. | |
| 8,843,353 B2 | 9/2014 | Posamentier et al. | |
| 8,903,659 B2* | 12/2014 | Van Hoek | G01V 1/30 702/13 |
| 2005/0152588 A1 | 7/2005 | Yoshida et al. | |
| 2006/0184488 A1 | 8/2006 | Wentland | |
| 2008/0123469 A1 | 5/2008 | Wibaux et al. | |
| 2008/0143718 A1 | 6/2008 | Ray et al. | |
| 2008/0175478 A1 | 7/2008 | Wentland et al. | |
| 2008/0270033 A1 | 10/2008 | Wiley et al. | |
| 2009/0003511 A1 | 1/2009 | Roy et al. | |
| 2010/0174489 A1 | 7/2010 | Bryant et al. | |
| 2010/0211363 A1 | 8/2010 | Dorn et al. | |
| 2010/0245347 A1 | 9/2010 | Dorn et al. | |
| 2011/0048731 A1* | 3/2011 | Imhof | G01V 1/32 166/369 |
| 2011/0307178 A1 | 12/2011 | Hoekstra | |
| 2012/0072116 A1 | 3/2012 | Dorn et al. | |
| 2012/0090001 A1 | 4/2012 | Yen | |
| 2012/0117124 A1 | 5/2012 | Bruaset et al. | |
| 2012/0150447 A1 | 6/2012 | Van Hoek et al. | |
| 2012/0197530 A1 | 8/2012 | Posamentier et al. | |
| 2012/0197531 A1 | 8/2012 | Posamentier et al. | |
| 2012/0197532 A1 | 8/2012 | Posamentier et al. | |
| 2012/0197613 A1 | 8/2012 | Vu et al. | |
| 2012/0257796 A1 | 10/2012 | Henderson et al. | |
| 2012/0322037 A1 | 12/2012 | Raglin | |
| 2013/0006591 A1 | 1/2013 | Pyrcz et al. | |
| 2013/0338927 A1 | 12/2013 | Kumaran | |
| 2014/0081613 A1 | 3/2014 | Dommisse et al. | |

FOREIGN PATENT DOCUMENTS

| | | |
|---|---|---|
| WO | WO 2009/126951 | 10/2009 |
| WO | WO 2009/142872 | 11/2009 |
| WO | WO 2012/090001 | 7/2012 |
| WO | WO 2013/048798 | 4/2013 |
| WO | WO 2014/116340 | 7/2014 |
| WO | WO 2015/034759 | 3/2015 |

OTHER PUBLICATIONS

Neidell, N.S. et al. (1971), "Semblance and other coherency measures for multichannel data," *Geophysics* 36, pp. 482-497.
Imhof, M.G. (2005), "Estimating Seismic Heterogeneity with the Structure Tensor," *Journal of Seismic Exploration* 13, pp. 247-261.
Lomask J. et al. (2006), "Flattening without picking," *Geophysics* 71, pp. 13-20.
Zeng, H. et al. (1998), "Stratal slicing, part II: real seismic data," *Geophysics* 63(2), pp. 514-522.
"Horizon Tracker—OpendTect: Free Open-Source Seismic Interpretation Software System", http://www.opendtect.org/index.php/features/horizon-tracker.html, Dec. 20, 2012, 2 pgs.
"OpendTech dGB Plugins User Documentation Version 4.4", HorizonCube, http://www.opendtect.org/rel/doc/User/dgb/chapter3.4_horizoncube_creator.htm, Oct. 18, 2012, 8 pgs.

(56) References Cited

OTHER PUBLICATIONS

"Horizon Propagation", Paradigm (2012), http://www.pdgm.com/Solutions/Interpretation-Modeling/Seismic-Interpretation/Automat . . ., Dec. 20, 2012, 1 pg.

* cited by examiner

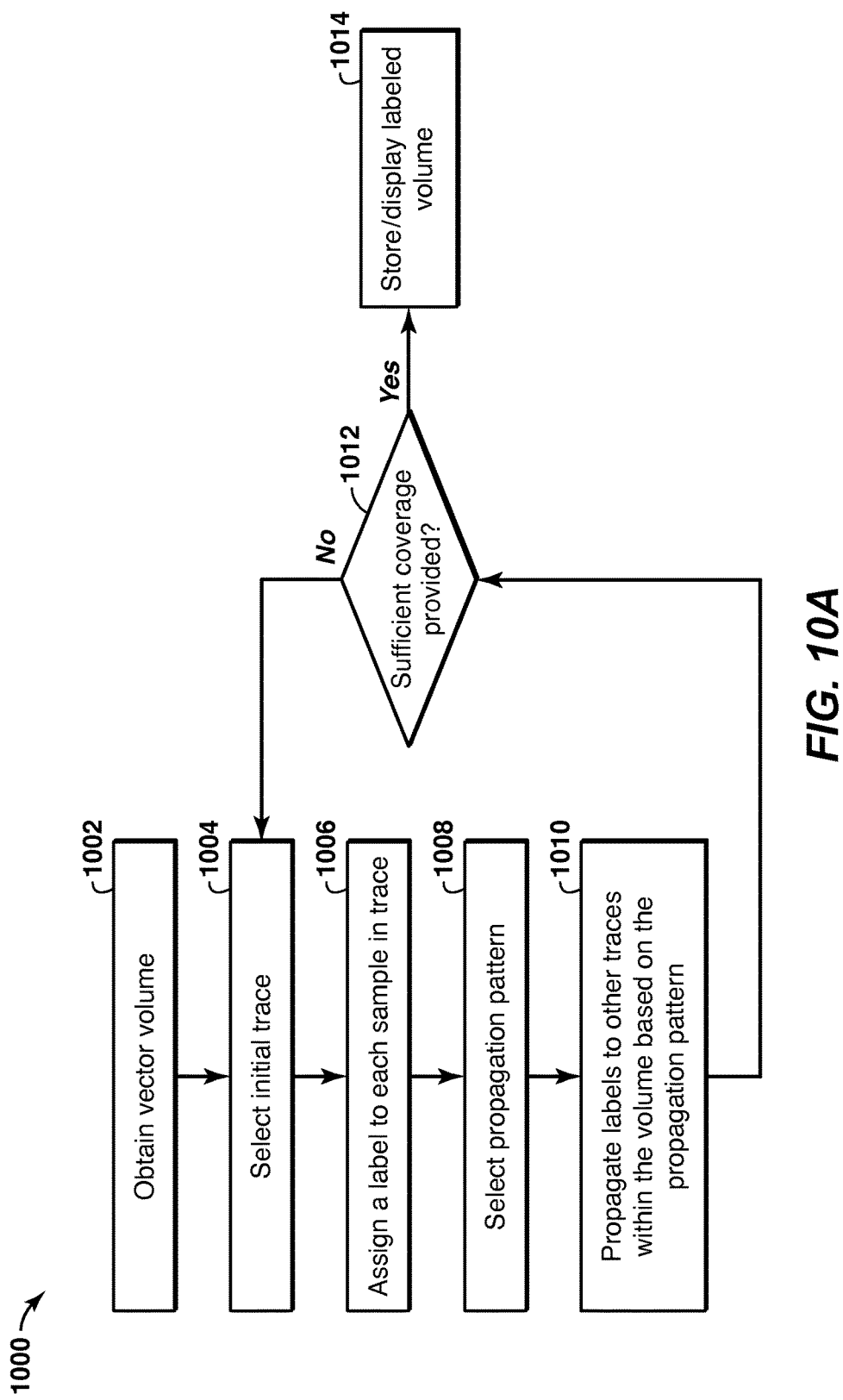

GEOPHYSICAL MODELING OF SUBSURFACE VOLUMES BASED ON HORIZON EXTRACTION

CROSS-REFERENCE TO RELATED APPLICATION

This application is the National Stage entry under 35 U.S.C. 371 of PCT/US2013/070531 that published as WO 2041/099201 and was filed on 18 Nov. 2013, which claims the benefit of U.S. Provisional Application No. 61/740,354, filed 20 Dec. 2012, the entirety of which is incorporated by reference herein.

FIELD OF THE INVENTION

This invention relates generally to the field of prospecting and more particularly to data processing. Specifically, the invention is a method for modeling subsurface volumes for one or more geophysical properties based on horizon extraction techniques.

BACKGROUND OF THE INVENTION

In the oil and gas industry, modeling of the subsurface is typically utilized for visualization and to assist with analyzing the subsurface volume for potential locations for hydrocarbon resources. Accordingly, various methods exist for estimating the geophysical properties of the subsurface volume (e.g., information in the model domain) by analyzing the recorded measurements from receivers (e.g., information in the data domain) provided that these measured data travel from a source, then penetrate the subsurface volume represented by a subsurface model in model domain, and eventually arrive at the receivers. The measured data carries some information of the geophysical properties that may be utilized to generate the subsurface model.

It is often useful to extract horizons from the seismic data. Horizon extraction in seismic data typically involves of identifying the locations of reflection events where an interface exists. These horizons may be extracted via peaks and or trends from the seismic data as these provide information about the geology that created the seismic response. For example, the ridge curves in 2-D, or ridge surfaces in 3-D, can be used to determine horizons (e.g., curves in 2-D data or surfaces in 3-D data) that correspond to peaks, troughs or zero-crossings of seismic attribute data like amplitude. Similarly, the interpretation of seismic data often involves the estimation of "trends." These are typically extracted manually by an interpreter to provide a visual aid, but noise and poor imaging require choices to be made (e.g., interpretation of the data) which introduces uncertainty into the process.

To address this concern, several methods exist to automate this process. For example, some methods use local trace correlations to grow a surface from initial (seed) locations. As an example, some software packages provide automatic horizon tracker that is based on a waveform tracking algorithm. See, e.g., Paradigm™ 3D Propagator™ (available at Paradigm's website on Dec. 20, 2012; URL included in the originally filed specification) and dGB's OpendTect (available at Opendtect's website on Dec. 20, 2012; URL included in the originally filed specification). While this technique is useful, it only addresses the issue of creating a single horizon at a time. In particular, horizons from earlier interpretations are merely visual aids and are not further used by this approach to enhance the process to define new horizons. Therefore, it becomes difficult to track multiple horizons and the inconsistencies that often arise.

Another example is a method that conformally defines a horizon based on existing horizons. See, e.g., Origin of gOcad (available at Gocad's website on Oct. 18, 2012; URL included in the originally filed specification). The new horizon is an interpolated surface between a top and a base horizon. As such, the interpolation uses the same parameter throughout the surface. This approach does relies upon an interpolation parameter in one location, which may not be adequate in another location on the horizon.

As the recovery of natural resources, such as hydrocarbons rely, in part, on a subsurface model, a need exists to enhance subsurface models of one or more geophysical properties. In particular, a need exists to enhance the horizon extraction process.

SUMMARY OF THE INVENTION

In one embodiment, a method is described for converting geophysical data into a stratigraphic model of the subsurface, i.e. a model showing horizons and reflection surfaces. The method includes obtaining a labeled volume associated with a subsurface volume, wherein the labeled volume has a plurality of traces and each of the plurality of traces include a plurality of samples and each sample associated with at least one of the labels; selecting one of the labels or a location associated with one of the labels in the labeled volume; extracting locations in the labeled volume associated with the selected label, comprising: for each sample, comparing the selected label with the label associated with a selected sample in the labeled volume; determining whether the comparison indicates that the label for the selected sample matches (e.g., is substantially the same as) the selected label; if the selected label matches the label associated with the selected sample, assigning the location of the selected label to the selected sample; if the selected label is not match the label associated with the selected sample, determining an interpolated location for the selected sample and assigning the interpolated location to the selected sample; combining the extracted locations into an object associated with the selected label; and one or more of storing the object in memory accessible by a computer system and displaying the object on a display accessible by the computer system.

In another embodiment, the method of producing hydrocarbons is described. The method includes utilizing an object to determine the location of hydrocarbons, wherein the object is created by: obtaining a labeled volume associated with a subsurface volume, wherein the labeled volume has a plurality of traces and each of the plurality of traces include a plurality of samples and each sample associated with one of the labels; selecting one of the labels or a location associated with one of the labels in the labeled volume; extracting locations in the labeled volume associated with the selected label, comprising: for each sample, comparing the selected label with the label associated with a selected sample in the labeled volume; determining whether the comparison indicates that the label for the selected sample matches the selected label; if the selected label matches the label associated with the selected sample, assigning the location of the selected label to the selected sample; if the selected label is not match the label associated with the selected sample, determining an interpolated location for the selected sample and assigning the interpolated location to the selected sample; combining the extracted locations into an object associated with the selected label; drilling a well to access the hydrocarbons; and producing the hydrocarbons from the well.

Further, in yet another embodiment, a system for converting data into a subsurface model is described. The system comprises a processor; a tangible, non-transitory machine-readable storage medium that stores a set of instructions for execution by the processor. The set of instructions are configured to: obtain a labeled volume associated with a subsurface volume, wherein the labeled volume has a plurality of traces and each of the plurality of traces include a plurality of samples and each sample associated with one of the labels; select one of the labels or a location associated with one of the labels in the labeled volume; extract locations in the labeled volume associated with the selected label, comprising: for each sample, compare the selected label with the label associated with a selected sample in the labeled volume; determine whether the comparison indicates that the label for the selected sample matches the selected label; if the selected label matches the label associated with the selected sample, assign the location of the selected label to the selected sample; if the selected label is not match the label associated with the selected sample, determine an interpolated location for the selected sample and assign the interpolated location to the selected sample; combine the extracted locations into an object associated with the selected label; and provide access to one or more of store the object in memory accessible by the processor and display the object on a display.

Further still, in another embodiment, a method of converting measured data into a subsurface model is described. The method comprises obtaining labeled volume associated with a subsurface volume, wherein the labeled volume has a plurality of traces and each of the plurality of traces include a plurality of samples and each sample associated with a surface number; obtaining a surface number perturbation map; selecting a surface number in the labeled volume; extracting locations in the labeled volume associated with the selected surface number, comprising: for each sample, comparing the selected surface number with the surface number associated with a selected sample in the labeled volume; determining whether the comparison indicates that the surface number for the selected sample matches the selected surface number; if the selected surface number matches the surface number associated with the selected sample, assigning the location of the selected surface number to the selected sample; if the selected surface number does not match the surface number associated with the selected sample, determining an interpolated location for the selected sample and assigning the interpolated location to the selected sample; combining the extracted locations into an object associated with the selected surface number; and one or more of storing the object in memory accessible by a computer system and displaying the object on a display accessible by the computer system.

BRIEF DESCRIPTION OF THE DRAWINGS

The foregoing and other advantages of the present disclosure may become apparent upon reviewing the following detailed description and drawings of non-limiting examples of embodiments.

FIGS. 10A and 10B are flow charts for performing the label propagation stage in accordance with exemplary embodiments of the present techniques.

Due to patent law restrictions on the use of color, FIGS. 2-7 are black-and-white reproductions of color originals.

DETAILED DESCRIPTION OF EXAMPLE EMBODIMENTS

Figure 1:
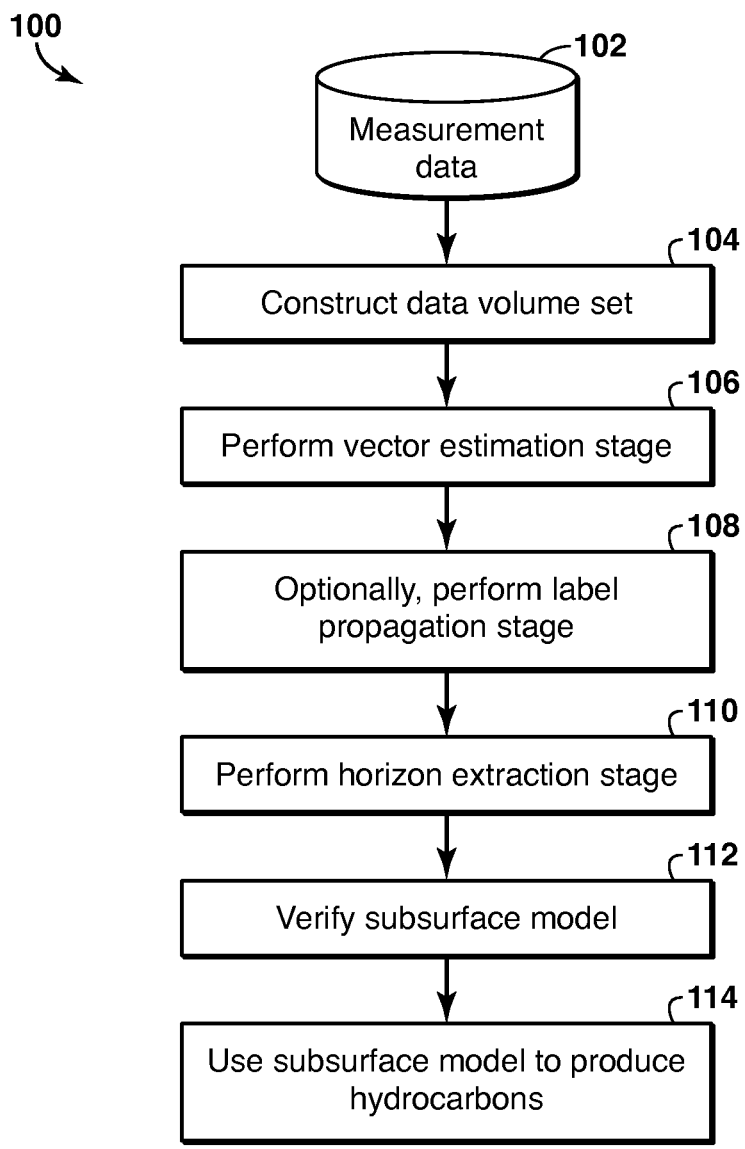
FIG. 1 is a flow chart for generating a subsurface model in accordance with an exemplary embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent. Further, various terms and reference characters that are the same are utilized in the equations and associated description within the disclosure.

The present disclosure describes methods and systems to enhance subsurface models. In particular, the present techniques involve interpreting and analyzing geophysical and geological data using a computer. As described further below, the present techniques are described for various volumes which include information associated with the subsurface. Each volume may include various traces, which may include different samples. The samples are associated with discrete segments or sections of the trace and organized based on a respective axis. As an example, the seismic traces in the data volume may include different samples distributed along a depth axis.

Further, the present techniques may utilize various stages, such as data preparation stage, vector estimation stage, label propagation stage, and horizon extraction stage to build the subsurface model. The stages may be combined together to form an interpretation system. The following flow charts, graphs and examples describe the various stages and interaction between various stages.

As an example, the stages may include a data preparation stage, vector estimation stage, label propagation stage, and horizon extraction stage. The data preparation stage may include acquiring and processing of seismic data to obtain one or more stacked 3-D volumes (e.g., data volumes) of a geophysical property, such as seismic attribute data (e.g., amplitude). The vector estimation stage may include processing the data volumes and produce a vector volume. This vector volume may be unique to each data volume or shared among attribute volumes (e.g., amplitude, phase or other attribute volumes). The label propagation stage may include selecting one or more starting traces, assigning labels to samples within each selected trace, and then propagating those labels along the vector volume to produce a labeled volume. Then; the horizon extraction stage may include selecting a location in the labeled volume and extracting all other locations with the same label from the labeled volume. From the combination of one or more of these stages, a subsurface model is produced. The subsurface model may be utilized to provide the location of subsurface resources. With this information, a wellbore may be drilled to provide a flow path from a subsurface region to a hydrocarbon processing facility to further process the hydrocarbons recovered from the subsurface volume.

The proposed process facilitates horizon interpretation by providing guidance, while allowing interactive control of the outcome. In one embodiment of this method, a stack of surfaces (SOS) is utilized to provide guidance similarly to the conformal mapping approach. But the new surface is the result of picking an index into the SOS at each location of the horizon (single-valued case). Fractional index values and interpretation is utilized by interpolating the height values between the corresponding surfaces (at the two closest integer index values). Therefore, the new surface may be anything that fits between the first and last surface of the SOS. The distribution of index values provides flexibility to this method. That is, the distribution of index values is done interactively whereby the user picks locations on the data, and the corresponding index values are extracted. Then, the index values are interpolated or extrapolated to the rest of the horizon. Thus, the present techniques differ from the conformal mapping because it can utilize multiple previously defined surfaces, instead of just two surfaces.

The approach to extracting horizons from a SOS lends itself to facilitating the extraction of new horizons based on previously extracted horizons. In one embodiment the SOS is automatically computed. As an example, techniques are described in Seismic Horizon Skeletonization, Intl. Patent Application Pub. No. 2009/142872; U.S. Pat. No. 7,769,546 to Lomask et al. and a paper entitled "Flattening without picking", Geophysics, vol. 71, pp. 13-20, 2006.

In another embodiment, the SOS is gradually built by the interpreter: interpret one horizon and insert into the SOS, interpret another horizon and insert that horizon into the SOS and continue the process. This iterative approach gradually improves the interpretation process by starting with input and providing more input as the interpretation session proceeds.

In yet another embodiment, a hybrid of the two techniques is utilized. Multiple SOS's (MSOS's) may be used, each of which provides a different level of accuracy or enhancement. For example, at the beginning of the interpretation iteration, the automatically computed SOS may provide sufficient guidance to enhance the process over prior art. As several horizons become available (e.g., the interpreter has produced the horizons) these horizons may now form an additional SOS that may provide more fine-tuned guidance than the original SOS: the second SOS is hand-picked. In general, many SOS's may be used simultaneously in this manner. Some may be automatically generated, some fully manually created, while others may be the result of mixing those two techniques.

In the present techniques, a label volume differs from other volumes because it encodes surfaces implicitly. A horizon in the label volume includes all locations where a given label (a number) exists. Should the number not be physically present in any of the discrete locations of the volume (e.g., the voxels), its location is interpolated between the neighbors with closest label values. This representation affords any geometry for horizons—including multi-valued horizons—as well as other geologically defined objects (e.g., faults, salt domes, etc.).

In other embodiment, it may be useful to extract peaks of seismic data, as these inform the geology that created the seismic response. These ridge curves in 2-D, or ridge surfaces in 3-D, can be a useful visual aid, but can also be building blocks for other methods. Troughs and zero crossings are useful for the same reason and extracting all three descriptors (peaks, troughs and zero-crossings) can produce a more reliable interpretation of the subsurface in a model. The proposed approach includes finding suitable seed points (e.g., local maxima) and then performing an integration of the data to produce curves or surfaces.

Determining a ridge curve that passes through a local maximum includes two computational stages: (i) approximating a tangent field and (ii) then numerically integrating. The first stage may be performed once on the data volume and the resulting vector field may be used to compute several ridge curves. The second stage of finding the ridge curves includes performing a particular kind of numerical integration. This stage begins with a seed point and then advances the point in the tangent direction according to a step size. It proceeds until a stopping criterion is met and the sequence of points constitutes an approximation of the ridge curve. Unlike the conventional approach, the proposed process computes the local tangents using an approximate tangent field to compute a local neighborhood ahead of the current point. Then, the neighborhood is analyzed and an appropriate tangent vector is selected. Thus, the tangent field is used as a guide and the curves are not necessarily faithful to it. Various aspects of the present techniques are described further in FIGS. 1 to 11B.

Certain embodiments of the present techniques may be implemented as a method, as described in the exemplary embodiments of a flow chart in FIG. 1. FIG. 1 is a flow chart 100 for generating a subsurface model in accordance with an exemplary embodiment of the present techniques. As noted above, this flow chart 100 includes a data preparation stage, which includes blocks 102 and 104, vector estimation stage, which includes block 106, label propagation stage, which includes block 108, and a horizon extraction stage in block 110. Further, the resulting subsurface model may be utilized to produce hydrocarbons as shown in block 114 and the process may be completed in block 116.

The process begins with the data preparation stage, which involves constructing data volumes from the measurement data, as shown in blocks 102 and 104. The measurement data is obtained in block 102. The measurement data may be obtained by performing a seismic survey (e.g., forming seismic waves with a source, recording the received signals related to the source at one or more receivers, and processing received data to form measurement data). The measurement data may include surface seismic data, check-shot seismic data, etc. Also, the measurement data may include controlled source electromagnetic data, microseismic and/or other types of measured data. Each of these different surveys may be performed in a manner known to those skilled in the art. This measurement data may be subjected to various processing steps to remove noise and/or other filtering to refine the measurement data. With the measurement data, a data volume set is constructed in block 104. The construction of the data volume set may include using the measurement data to populate the different nodes or cells within the data volume set. The data volume set may include an image and/or a property volume of one or more geophysical properties, such as density, porosity, S-wave velocity ($v_s$), P-wave velocity ($v_p$), fluid saturation, and the like. The data volume may include any number of volumes and may include one or more attribute volumes, instantaneous phase volumes, amplitude volumes, other attribute volumes, and any combination of such volumes. These volumes may include the same grid. As a specific example, the data volume set may be a seismic image or a velocity model. Each of the data volumes may include various traces, which are representative of the subsurface formation. These traces may include samples, which are associated with discrete segment or sections of the seismic trace and organized based on a respective axis. As an example, the seismic traces in the data volume may include different samples distributed along a depth axis.

With the data volumes, the vector estimation stage may be performed, as shown in block 106. The vector estimation stage, which is described further in FIG. 2 and the associated paragraphs in one embodiment, may include performing measurements on each of the data volumes to obtain a corresponding vector volume, and then combining the multitude of vector volumes into a composite vector volume which constitutes the output of this stage. For example, the combination may be performed interactively whereby a user selects regions of the output volume and assigns a source vector volume to each region. Alternatively, the assignment may be automatic whereby a measure of confidence in a vector measurement (as described below) is used to select the most confident vector volume at each location (e.g., highest measure of confidence). The confidence is the uncertainty or indication of the reliability of the vector volume.

Then, the label propagation stage may be performed, as shown in block 108. The label propagation stage, which is described further in FIGS. 11A and 11B and the associated paragraphs as certain embodiments, may include selecting one or more initial traces, assigning labels to each sample of each trace, selecting a propagation pattern, and propagating the labels from the initial traces along the vector volume obtained in the previous stage. Alternatively, the output of this stage may be a specific type of labeled volume, such as a stack of surfaces. A stack of surfaces (SOS) consists of and indexed arrangement of several surfaces. Each surface is a collection of height values over a plane. Thus, an SOS is a volume having two dimensions of position—that define the location of points over a plane- and a third dimension that is an index so that the point SOS(x,y,i) refers to the height value of surface i at position (x,y). The trace selection step may be performed by hand and a single trace may be sufficient. The labels may be real numbers and may be unique to each sample, or the same label may be assigned to different samples. Alternatively, an automatic trace selection algorithm may optimally choose both the trace locations and the label assignments of their samples so that the least number of traces are used and so that each sample in the volume is assigned a sufficiently unique label by the label propagation algorithm. For the complete coverage of the volume, the selection of one or more initial traces may also be iterative, whereby a trace is selected, labels assigned to its samples, propagation of labels performed, and then another or new trace is selected and labels are assigned to it. Given a partial assignment of labels in the volume, such as to the initial trace, the propagation pattern specifies the neighboring traces that do not have labels assigned to them (e.g., the traces to be processed next). In one embodiment, this pattern proceeds by first selecting traces along an inline or a cross-line starting at the initial trace and then completing the label propagation by propagating in the orthogonal direction. As another example, the pattern selects traces closest to the processed traces in a radial pattern moving away from the initial trace.

As a further enhancement, the formation of a stack of surfaces may be included as part of the label propagation stage. To obtain a stack of surfaces directly from this stage, the labeled traces are temporarily stored, but only the traces along the edge of propagation need to be stored and those traces with no neighbors that still need to be assigned may be removed. Before removing a labeled trace, certain predetermined labels may be verified and the location at those labels may be stored in a stack of surfaces.

The horizon extraction stage may be performed, as shown in block 110. The horizon extraction stage, which is described further in FIGS. 11A and 11B and the associated paragraphs as certain embodiments, may include selecting a labeled volume, selecting a point in the labeled volume to select a label, and extracting all locations where the label is present. If the label does not appear at a physical location in the volume (e.g., it is not on a grid point), then the label location in the volume is the result of an interpolation of the locations of the nearest labels that do appear in the volume. This interpolation may be linear, multi-linear, or higher order. In another embodiment where the labeled volume is a stack of surfaces (SOS), the surface extraction process includes combining one or more (e.g., at least one) surface in the SOS to produce a horizon. For example, the final horizon may be the result of picking a depth value at each spatial location from some surface in the SOS. This may include assigning the surface index at each such location. Also, if the surface index is fractional—e.g., no such surface exists in the SOS—then the resulting depth value is the interpolation of the depth values of the surfaces at the two closest integer indices with interpolation parameter given by the fractional part of the original index. Thus, a parameter surface of fractional indices may completely describe the final horizon. Obtaining such a parameter surface may be achieved in a user-guided fashion or automatically. For example, a user may select a number of locations where the horizon should exist, which establishes an index (possibly fractional) for each such location, and then those indexes are propagated to the rest of the surface. This is "index propagation," which is distinct from the label propagation described in the previous stage, but it may utilize similar techniques. Alternatively, the index propagation may be the result of a weighted average that preserves the values at the selected locations. Another approach may include a harmonic or bi-harmonic extrapolation, as described by Hale in "Image-guided blended neighbor interpolation", 80$^{th}$ Annual International Meeting, Society of Exploration Geophysicists, 2010.

Once the subsurface model is generated, the subsurface model is verified in block 112. The verification of the subsurface model may include comparing regions of the subsurface model to well log data, seismic data, controlled source electromagnetic data or other measured data to determine if the subsurface model satisfies the geologic properties and/or other constraints. This comparison may involve simulating the measured data response and comparing the simulated data with the measured data by solving an objective function. Then, the subsurface model may be updated through various techniques to minimize the objective function. This process may be iterative until a specific threshold is satisfied. Also, geologic concepts may be used to inspect the model manually and interactively. To further evaluate the model and the prospects that it describes, multiple scenarios (models) generated in the above method may be used to produce statistical information, such as probability of hydrocarbon presence.

Beneficially, this process may be utilized to enhance the model construction process. This process provides horizons in a more efficient manner and updates these horizons, which are not provided with current techniques. That is, the determination of horizons and updating of horizons are performed in a more efficient manner.

Figure 2:
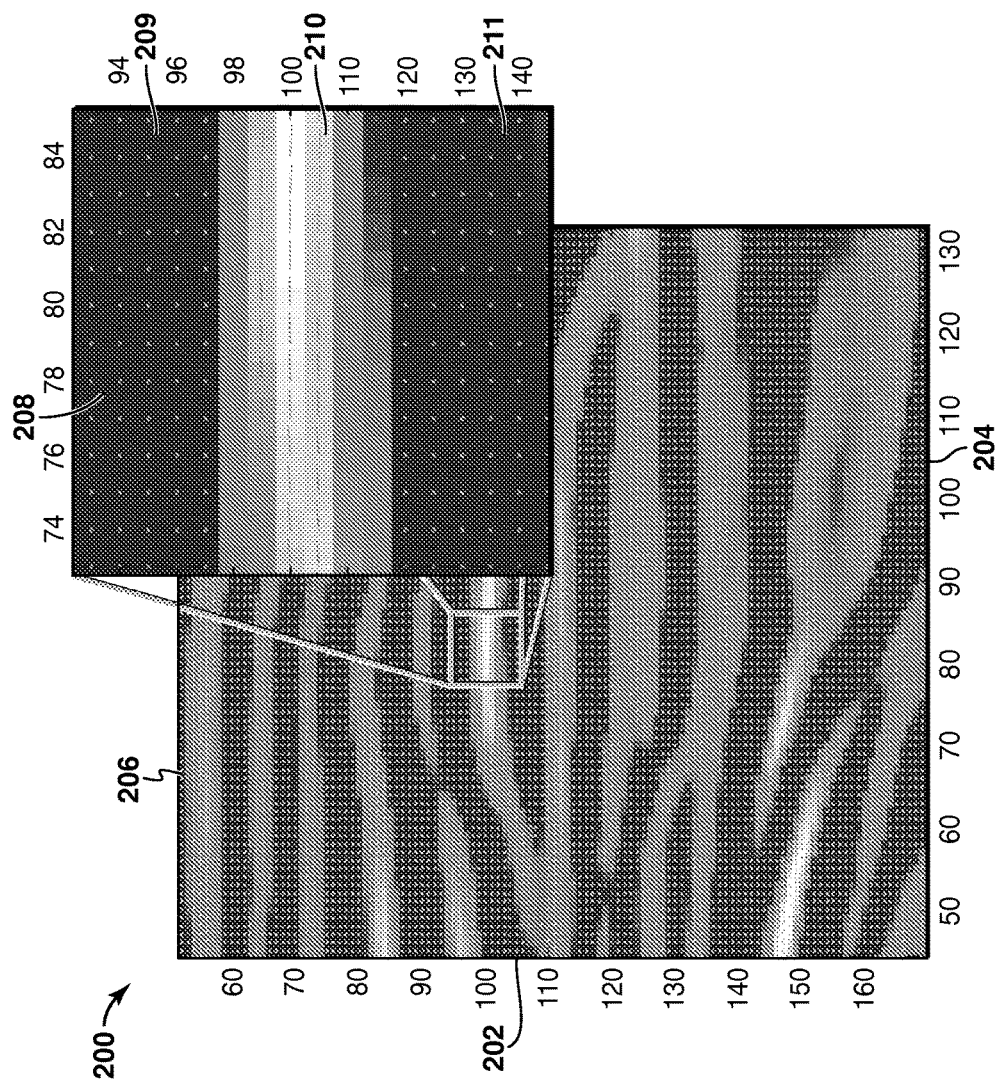
FIG. 2 illustrates a graph associated with approximation of ridge tangents in accordance with an exemplary embodiment of the present techniques.
Figure 3A:
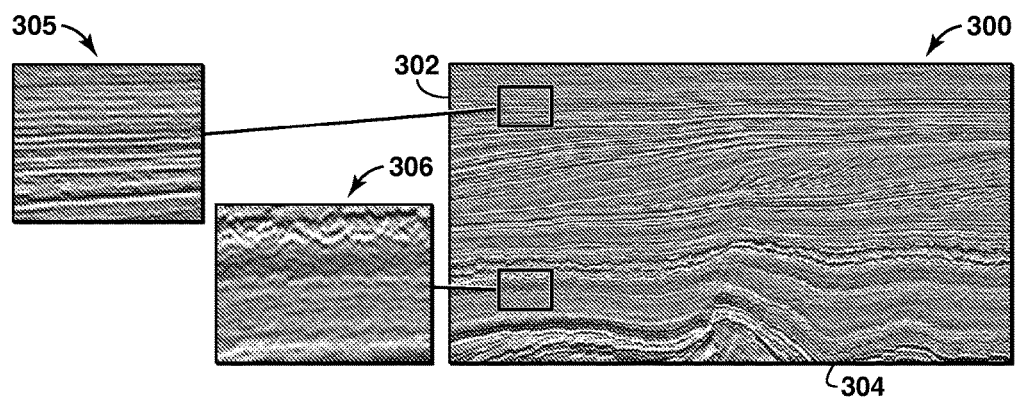
FIGS. 3A to 3C illustrate graphs associated with structured tensor and/or iso-surface tensor methods in accordance with an exemplary embodiment of the present techniques.
Figure 3B:
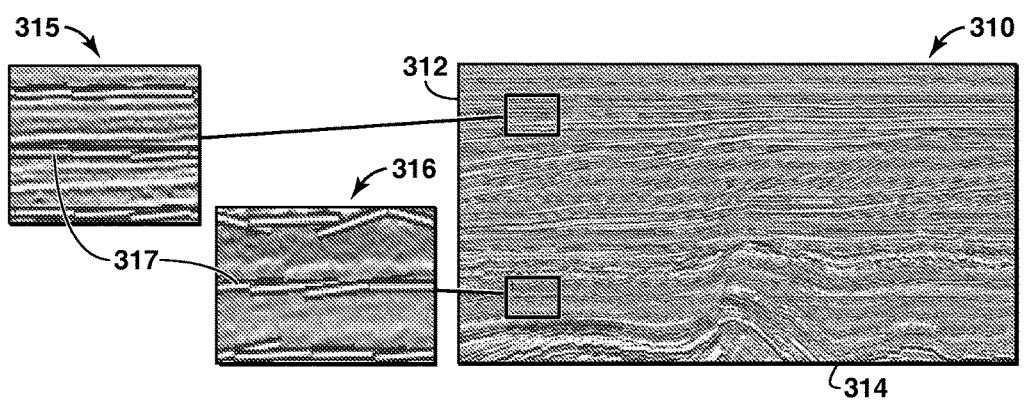
Figure 3C:
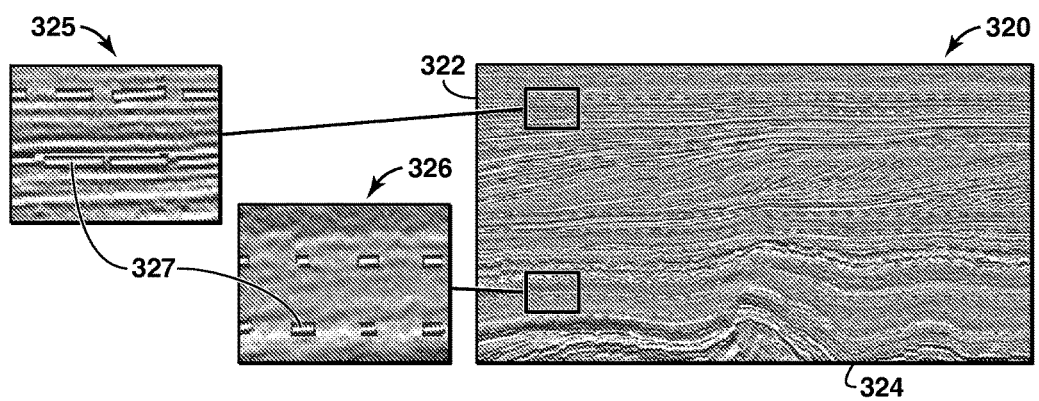

The vector estimation stage, which is noted in the block 106 of FIG. 1, may be computed through various methods, such as ridge tangent methods, structured tensor method and/or iso-surface tensor method, as some examples. The data utilized as input into the vector estimation stage, which may be a data volume set, may include an image and/or a property volume of a specific geophysical property, such as a seismic attribute (e.g., amplitude, velocity, such as P-wave velocity and S-wave velocity, attenuation), as noted above. As a specific example, the data volume set may be a seismic attribute data volume, for example, such as amplitude. The output of the vector estimation stage is a vector field or vector volume, which assigns a vector to each location of the input data (e.g., at each voxel or pixel depending on the data being three dimensional (3-D) or two dimensional (2-D), which may also be referred to as samples or cells). That is, the individual vectors in the vector field or volume of vectors, which based from the input data (e.g., 2-D or 3-D), is an estimate of either tangent or normal vectors to the measured data that follow similar scalar values in the original data (e.g., the data utilized in computing the vector volume, which may be an image or an attribute volume). For example, in seismic data, the vectors represent the geometry of peaks (e.g., ridges) or troughs in a seismic data volume. Accordingly, two exemplary embodiments are described below with one associated with the ridge tangent method, as shown in FIG. 2, and the second associated with iso-surface tensor method, as shown in FIG. 3A-3C.

As a first embodiment, a method of computing a tangent to the closest ridge curve within a fixed neighborhood around each spatial location P is provided for two dimensions (2-D). Given a spatial location P, which is represented as ($P_x$, $P_y$), the method involves extracting a neighborhood (denoted N) around it by equation (e1) and recording the amplitude (or attribute) values there denoted by W(Q).

The neighborhood N may be calculated by equation (e1):

$$N=\{Q||Q_x-P_x|<n, |Q_y-P_y|<n\} \quad (e1)$$

where subscripts x and y refer to the spatial location along the x-axis and y-axis respectively, and the neighboring location or point Q has spatial coordinates $Q_x$ and $Q_y$, and n is the radius of the neighborhood N. The neighborhood may include a neighborhood size and shape.

In this calculation, the data values, which may be as many as $(2n+1)^2$, may be expressed as weights to approximate the y-values, which represent time or depth in a seismic line (e.g., composed of one or more seismic traces), as a linear function of the x-values.

To extract the slope m, equation (e2) may be solved $$y=mx+k \quad (e2),$$

where m is the slope and k is the intercept. This calculation may be used because in seismic data no vertical lines exist. The approximation is computed by performing a linear regression, which, for example, may be achieved by solving the following linear system of equations (e3):

$$\begin{bmatrix} \sum_{Q \in N} W(Q)Q_x^0 & \sum_{Q \in N} W(Q)Q_x^1 \\ \sum_{Q \in N} W(Q)Q_x^1 & \sum_{Q \in N} W(Q)Q_x^2 \end{bmatrix} * \begin{bmatrix} k \\ m \end{bmatrix} = \begin{bmatrix} \sum_{Q \in N} W(Q)Q_y Q_x^0 \\ \sum_{Q \in N} W(Q)Q_y Q_x^1 \end{bmatrix}; \quad (e3)$$

where the terms are as previously defined and the superscripts denote exponents, and W(Q) is the weight associated with that spatial location (e.g., data value at that spatial location). With the slope m, the unitary tangent vector at spatial location P can be computed so that its x-component is positive. Further, the tangent vectors may be scaled by weights according to equation (e4):

$$W'(x,y) = \left( \frac{W(x,y) - \min(W)}{\max(W(x,y) - \min(W))} \right)^p; \quad (4)$$

where p is the power in equation (e4), and W'(x,y) is the normalized weights, W(x,y) is weight of spatial location (x,y) obtained as a function of the data volume, and min(W) is the minimum of the weight of the spatial location being considered (e.g., neighborhood N), and max(W) is the maximum of the weight of the spatial locations being considered (e.g., neighborhood N). In one example, the power p may be selected to be in the range from 3 to 15, or may equal 10 to provide resolution of the trend data. This normalization emphasizes the larger weights which is desirable for capturing the geometric trends of peaks in the data. Finding troughs or zero-crossings would require to first transform the original data so that those events have a larger value than the others (e.g., multiply by −1 for troughs).

A graph of this is provided in FIG. 2, which shows an example of the tangents computed utilizing the above techniques as an example of an approximation of the ridge tangents. In particular, FIG. 2 is an exemplary graph 200 of a vector field for a portion of the subsurface volume (e.g., a portion of a data volume), which includes various troughs (e.g., blacks regions) and peaks (e.g., yellow, orange and red regions). In this graph, the depth of the subsurface volume is shown along the axis 202 in units of sample number and distance is shown along axis 204 in units of trace number. Further, the vectors in the vector field are shown as a multitude of segments each of which denotes orientation and unit-less relative magnitude (through its angle and length) but omits direction, which is not used in the subsequent calculations. The color black is associated with troughs and the colors red, orange and yellow are associated with increasing magnitude from red to orange to yellow. The vector field 208 is an expanded portion of the vector field 206. As shown in this vector field 208, the peak 210 is disposed between portions of two troughs 209 and 211. As shown in this graph, the graph illustrates that a vector volume may be calculated from the data volume, as described in the process noted above.

In three dimensions (3-D), this method of computing the ridge tangent is similar to the discussion above, except that the approximation is computed to a plane instead of a line. The data, which is collected analogously in 3-D, is therefore fit to the equation (e5):

$$z = ax + by + c \quad (e5)$$

by solving the linear system in equation (e6):

$$\begin{bmatrix} \sum W(Q) & \sum W(Q)Q_y & \sum W(Q)Q_x \\ \sum W(Q)Q_y & \sum W(Q)Q_y^2 & \sum W(Q)Q_xQ_y \\ \sum W(Q)Q_x & \sum W(Q)Q_xQ_y & \sum W(Q)Q_x^2 \end{bmatrix} * \begin{bmatrix} c \\ b \\ a \end{bmatrix} = \quad (e6)$$

$$\begin{bmatrix} \sum W(Q)Q_z \\ \sum W(Q)Q_zQ_y \\ \sum W(Q)Q_zQ_x \end{bmatrix}$$

where the sums are taken over points Q in the neighborhood N, W (x, y, z) is the weight corresponding to a point in the data (e.g., the transformed data value as in the 2-D example above), and a, b and c are constants and unknowns in the linear problem of equation (e5). The equation (e6) is derived by looking to minimize the objective function $O(a, b, c) = \Sigma_{Q \in N} W(Q)(z-(ax+by+c))^2$. The minimization and the linear equation in (e6) is obtained by setting the gradient of O to zero, i.e.

$$\begin{bmatrix} \partial O / \partial x \\ \partial O / \partial y \\ \partial O / \partial z \end{bmatrix} = 0.$$

Alternatively, in a second embodiment, a method may involve using the iso-curves and iso-surfaces in an iso-surface method. In this method, local measurements are obtained in a tensor field that includes iso-surface tensor $T_p$ at each location P in the data volume set. Each iso-surface tensor $T_p$ is computed in a similar process. First, a similarity vector is computed using equation (e7):

$$\vec{v}_P^Q = \sigma(P, Q) \frac{(Q-P)}{\|Q-P\|}; \quad (e7)$$

where the similarity vector is $\vec{v}_p^Q$. The similarity vector $\vec{v}_p^Q$ may be computed for each of its neighbor points Q in a predefined neighborhood (e.g., the neighbor point Q within a fixed distance of spatial location P). The magnitude of the vector is the similarity $\sigma(P, Q)$ of the data values at the spatial location P and at neighbor point Q, which may be expressed in equation (e8):

$$\sigma(P,Q) = \exp(-|data(P) - data(Q)|) \quad (e8)$$

and the direction is the unit vector that joins spatial location P to point Q (here data(P) and data(Q) are the data values at the respective locations).

The iso-surface tensor $T_p$ at location P is then computed as the sum of the outer products of each similarity vector $\vec{v}_p^Q$, as noted in equation (e9)

$$T_P = \Sigma_{Q \in N(P)} \vec{v}_Q * \vec{v}_Q^T \quad (e9);$$

where N (P) denotes the desired neighborhood of the point P and the outer product is defined as by equation (e10):

$$\vec{v}_Q * \vec{v}_Q^T = \begin{bmatrix} v_x v_x & v_x v_y & v_x v_z \\ v_y v_x & v_y v_y & v_y v_z \\ v_z v_x & v_z v_y & v_z v_z \end{bmatrix}; \quad (e10)$$

where $v_x$, $v_y$, and $v_z$ denote the three components of the vector $\vec{v}_Q$. This matrix defines the system in 3-D, while the 2-D system may be represented by the upper left two-by-two sub-matrix from the matrix in equation (e10). The resulting matrix (whether in 3-D or 2-D) is the tensor that captures the geometric information. Specifically, the vector describing the geometry of a reflection event in the vicinity of a point P may be obtained through an eigen-decomposition of the matrix. The eigen-vectors of the tensor at location P capture the local behavior of the data. The eigen-values may be used to obtain the correct eigenvector for the purpose of choice (e.g., tangent to a curve or normal to a curve). For example, the eigen-values of the tensor may be set, such that $\lambda_1 \geq \lambda_2 \geq \lambda_3$, and the associated eigenvectors may be represented as eigen-vectors $v_1$, $v_2$, $v_3$, these subscripts 1, 2 and 3 relate the v and $\lambda$, to each other. The dominant eigen-vector $v_1$ indicates the direction having similar data points. In 2-D examples, the dominant eigen-vector $v_1$ approximates the tangent to the iso-curve at location P. In addition, the smallest eigen-vector $v_3$ in 3-D approximates the normal to the tangent plane of the iso-surface of the data at location P. These properties together with the nature of the measurements suggest that a notion of relative confidence in the measurement may be inferred as follows.

In 2-D, the confidence conf that the tensor describes a tangent can be calculated by equation (e11):

$$conf = \frac{\lambda_1 - \lambda_2}{\lambda_1}, \quad (e11)$$

and in 3-D, the confidence that the tensor describes a plane can be calculated by equation (e12):

$$conf = \frac{\lambda_1 - \lambda_2 - \lambda_3}{\lambda_1}. \quad (e12)$$

As an example, FIGS. 3A to 3C represent a comparison of the quality of confidence measures (e.g., the "coherence" of the structure tensor versus the measure described above). See, for example, M. G Imhof, 'Estimating Seismic Heterogeneity with the Structure Tensor', Journal of Seismic Exploration, 13(3), 247-261, 2005. In particular, FIGS. 3A to 3C illustrate graphs associated with structured tensor and/or iso-surface tensor methods in accordance with an exemplary embodiment of the present techniques. Specifically, the graph 300 is a seismic image, graph 310 is a graph generated from the structured tensor method and graph 320 is a graph generated from the iso-surface tensor method. In the graphs 300, 310 and 320, the depth of the subsurface volume is shown along the axis 302, 312 and 322 in units of sample number, respectively, and distance is shown along axis 304, 314 and 324 in units of trace number, respectively. In the graphs 310 and 320, the data trends (e.g., the orientation of the vectors) are shown as yellow lines, and the confidence values are depicted as the length of those lines (e.g., confidence lines 317 and 327). The longer yellow lines represent a higher confidence in the measurement data, while the shorter yellow lines indicate a lower confidence in the measurement data.

As shown in these graphs 3B to 3C, the confidence of the iso-surface tensor method varies within the graph more than the confidence of the structure tensor method. In these graphs 310 and 320, the longer segments represent higher confidence. This aspect is further clarified in comparing the selected regions 305, 306, 315, 316, 325 and 326. In particular, the regions 305, 315 and 325 appear to represent the same feature and regions 315 and 325 each contain consistent confidence lines (e.g., consistent trends), which indicates high confidence. For the regions 306, 316 and 326, these regions 306, 316 and 326 appear to represent the same feature, but region 316 generated from the structured tensor method appears to have high confidence in the measurement data, while the region 326 generated from the iso-surface tensor method has low confidence, as compared to each other. This uncertainty in the region 326 is clearly not indicated for the region in the structured tensor method, but is indicated in the graph based on the iso-surface tensor method.

Regardless of the method utilized to obtain a tensor field (e.g., using the structure tensor or the iso-surface tensor method described herein and represented in graphs of FIGS. 3B and 3C), it is possible to represent the tensor field so that averages over contiguous rectangular regions may be computed efficiently. That is, a representation, such as a Summed Area Tables (SATs), may be utilized. These SATs may be utilized to enhance the efficiency of repeatedly calculating areas, which may be utilized in the smoothing operations.

This process may include computing the cumulative tensor field csTF along each dimension independently, but in sequence. Specifically, this may involve calculating the cumulative sum tensor field by solving the following equations (e13, e14 and e15):

$$csTF_x(x,y,z) = \sum_{w=1}^{x} TF(w,y,z) \quad \text{(e13)}$$

and, then $$csTF_y(x,y,z) = \sum_{w=1}^{y} csTF_x(x,w,z) \quad \text{(e14)}$$

and, then $$csTF(x,y,z) = \sum_{w=1}^{z} csTF_y(x,y,w) \quad \text{(e15)}$$

where TF(x,y,z) is a tensor at location (x, y, z) in the 3-D volume, and csTF is the cumulative sum tensor field. Please note that in 2-D applications, the calculations involve cumulative sum tensor fields for the x and y components, but not the z component.

Once the cumulative sum tensor field is calculated, the average or, equivalently, the sum of the tensors may be computed. If a rectangular region is utilized in 2-D, it may be defined by equation (e16):

$$R = [x_0 \ldots x_1, y_0 \ldots y_1] \quad \text{(e16)}$$

where the region R spans the interval between $x_0$ and $x_1$ and the interval between $y_0$ and $y_1$. The tensor describing the region R (e.g., the sum of tensors inside R) may be computed by a linear combination of the cumulative tensors at the four corners denoted $T_1$, $T_2$, $T_3$ and $T_4$, where TF(x,y) is a tensor at location (x, y) in the 2-D volume, and obtained from cumulative sum tensor field csTF as described by equations (e17):

$$T_1 = csTF(x_0-1, y_0-1)$$

$$T_2 = csTF(x_0-1, y_1)$$

$$T_3 = csTF(x_1, y_0-1)$$

$$T_4 = csTF(x_1, y_1) \quad \text{(e17)}.$$

Then, the tensor describing region R, denoted by T, is the result of the calculation in equation (e18):

$$T = \sum_{(x,y) \in R} TF(x, y) = T_4 - T_3 - T_2 + T_1. \quad \text{(e18)}$$

In computing the cumulative tensor T, the calculation involves only four tensor additions instead of one per tensor in the region (e.g., $(x_1-x_0)(y_1-y_0)$), tensor additions required without the SAT representation. In other words, this calculation does not depend on the size of the region R, and may extract the average tensor T at the same constant computational cost for large regions R or for small ones. Accessing the equivalent tensor in three dimensions is also a constant time effort but involves eight tensor operations instead of four. Here, the region in 3-D is defined by equation (e19)

$$R = [x_0 \ldots x_1, y_0 \ldots y_1, z_0 \ldots z_1] \quad \text{(e19)},$$

where the terms are as in equation (e16), but with a third interval added to capture the extra dimension. The eight corner tensors are defined in equations (e20a) and (e20b):

$$T_1 = csTF(x_1, y_1, z_1), T_2 = csTF(x_0-1, y_1, z_1), T_3 = csTF(x_1, y_0-1, z_1), T_4 = csTF(x_1, y_1, z_0-1), T_5 = csTF(x_0-1, y_0-1, z_1), T_6 = csTF(x_0-1, y_1, z_0-1), T_7 = csTF(y_0-1, z_0-1), \quad \text{(e20a)},$$

and $$T_8 = csTF(x_0-1, y_0-1, z_0-1) \quad \text{(e20b)}.$$

Then, the average tensor is computed according to equation (e21):

$$T = \sum_{(x,y,z) \in R} TF(x, y, z) = T_1 - T_2 - T_3 - T_4 + T_5 + T_6 + T_7 - T_8 \quad \text{(e21)}$$

where, as in the 2-D case, (x,y,z) denotes a location in the 3-D volume, R is the region being averaged, TF is the tensor field (e.g., the original tensor field), $T_i$ for i=1 to 8 is a cumulative tensor at corner number i of the region R, and T is the desired average tensor.

In this representation, the summed area tables (SATs) may apply to any set of objects that (i) form an Abelian group, (ii) are defined on a regular lattice (2-D or 3-D), and (iii) require efficient calculations of this sort (e.g., sums over areas or volumes).

The above representation defines scale as the averaging of tensors over a rectangular region. The tensors define a different coordinate system, which is represented by their eigen-vectors, and where a weight (e.g., the eigen-value) is associated to each axis. Thus, another notion of scale is obtained by averaging tensors in the ellipse in 2-D or ellipsoid in 3-D, which are defined by this coordinate system. The resulting tensor incorporates nearby measurements that support with the measurement at the center of the coordinate system. The consistency of these measurements—i.e. how similar the measurments are within the prescribed neighborhood—is captured by the resulting tensor through the distribution of eigenvalues: the closer the eigenvalues the less consistent the measurements.

In addition to the vector estimation stage, the label propagation stage, which is noted in the block 108 of FIG. 1, may also be implemented through various methods, such as the first order partial differential equations (PDEs) method or through a harmonic interpolation as described further below, as examples. The data utilized as input into this stage may be the output from the vector estimation stage, which may be a vector field or vector volume, which assigns a vector to each location of the input data (e.g., at each voxel or pixel depending on the data being three dimensional (3-D) or two dimensional (2-D)). The output of the label propagation stage is labeled volume, which may include a labeled volume in FIG. 10A or a stack of surfaces in FIG. 10B.

Figure 4A:
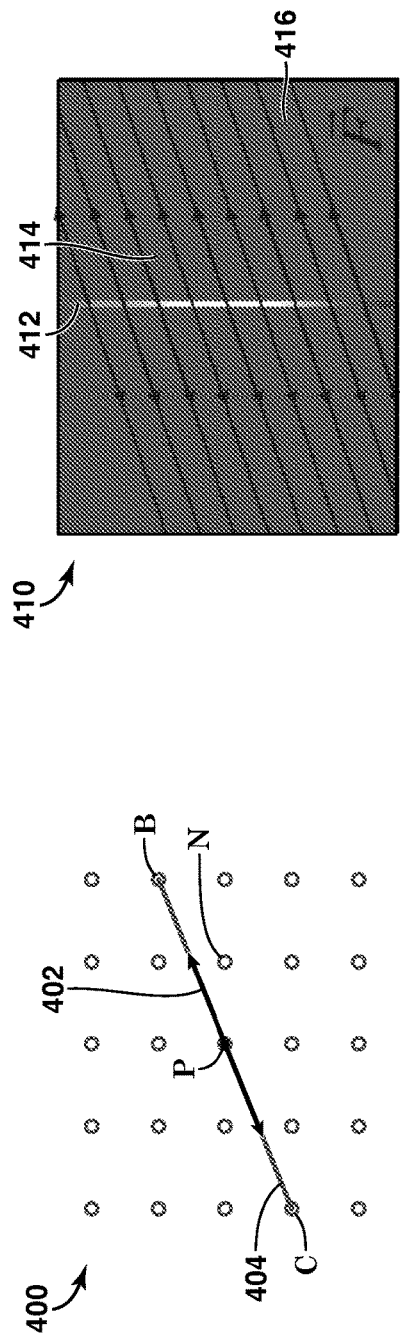
FIGS. 4A to 4C illustrate graphs associated with a boundary value method in accordance with an exemplary embodiment of the present techniques.
Figure 4B:
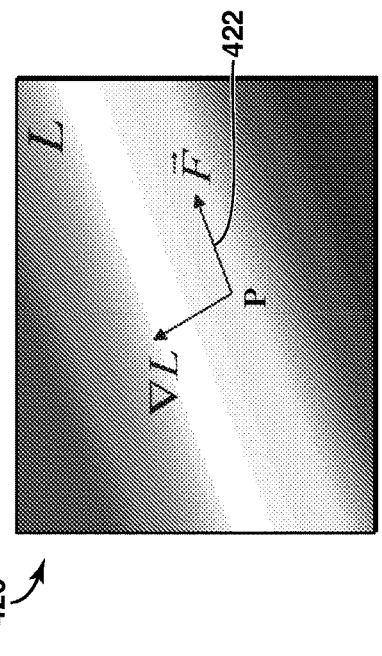
Figure 4C:
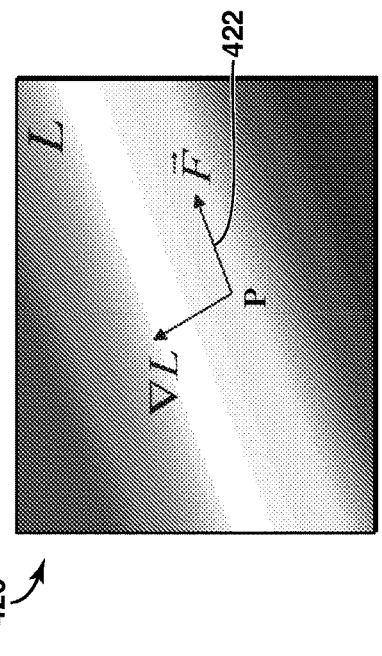

The label propagation stage may include extracting different surfaces from the vector field and a seed point (e.g., one or more traces). However, extracting many surfaces simultaneously may be achieved more efficiently with the use of the label propagation stage. In the label propagation stage, a label propagation problem is determined and solved. Following the acquisition of a vector field (e.g., vector volume), the problem includes selecting a seed trace and a distribution of labels (e.g., real numbers denoting, rock type, well log data, etc.) for each of the samples in that trace. The label propagation problem involves propagating these labels from the trace to the other traces (e.g., dips) in the other portions of the volume. Accordingly, two exemplary embodiments are described below for two methods, such as a boundary value method—also called the first order PDE method—(e.g., the trace with labels provides the boundary values), as shown in FIGS. 4A to 4C; and a harmonic interpolation method that discretely encodes the local geometric estimates (e.g., dip, azimuth, etc.—are used in two different ways to define the PDEs), as shown in FIG. 5A to 5D.

If the seed point is two or more traces, the labels may be generated based on some combination from the traces, which may include seismic traces. For example, two labeled volumes are computed—one for each seed trace—and then the results are combined into one labeled volume. This operation could, for example, be restricted to certain regions (e.g., in a first region use a first labeled volume and in a second region use the other one) whereby the regions may further be the result of manual delineation or bounding surfaces obtained from either of the labeled volumes. The latter example is especially desirable because a single trace may not reach all voxels in a volume. That is, the vector field may restrict the propagation of labels to a sub-volume. Thus, a second trace (or, more generally, a subsequent trace) may be placed so that second propagation (or, equivalently, subsequent propagation) covers the region that was not reached by the previous trace propagation.

The boundary value method is described as one label propagation method that may be utilized. This method utilizes at least one seismic trace to define the different labels for the vector volume based on the values in the seismic trace. These values are utilized to form the boundaries of the boundary value problem (in the sense of the PDEs). The trace may be selected by a user or may be determined by the boundaries of the volume being modeled. In this manner, the partial differential equations described below may be solved uniquely and, consequently, initial trace labels are propagated to form the labeled volume.

As a specific example, dips may be determined in a seismic trace through known methods, such as using trend analysis. Undirected vectors are available in 2-D or tangent planes given by their normal vectors, which are available in 3-D. Such vectors may be used to compute the global geometry of the dataset assuming that an appropriate boundary condition is provided. For example, the boundary conditions may be defined by assigning labels (i.e. numbers) to each of the samples along a trace in the volume. Then, the vectors are used by the PDE to effectively propagate those labels along the vectors to the rest of the volume. In this method, a seismic trace may be selected by a user and the seismic trace may be utilized to form the labels within the vector volume, as they are distributed. These labels need only be along a single file of pixels or voxels, which may be oriented along the time dimension of the measurement data (e.g., the data volume set). Then, the labels at each of the remaining pixels or voxels may be determined, such that a location has the same label as nearby locations along a dip.

This method, which employs a partial differential equation that codifies harmonic interpolation, may be expressed by the following equations (e22 and e23):

$$L(A)-L(B)=0 \qquad \text{(e22), and}$$

$$L(C)-L(A)=0 \qquad \text{(e23),}$$

where L(A) denotes the label at location A, L(B) denotes the label at location B and L(C) denotes the label at location C. The points B and C are chosen such that the dip at A is represented by the segment joining B to A to C.

This label propagation method is further explained in FIG. 4A. In FIG. 4A, an exemplary graph 400 of locations is shown for a vector volume in a discrete mesh. The connectivity within the mesh is shown for a location P, which is surrounded by various location or nodes, such as neighbor location N, and locations C and B. The dip at location P is shown in the red line 404 and cannot be represented by joining P to its immediate grid point neighbors. Instead, to capture the desired dip, the location P is connected directly to locations B and C even though those locations are not immediate neighbors of location P in the mesh. These locations are along the line 404, which is an extension of the vector 402. The connection thus described is realized as a high diffusion coefficient in the PDE that the method solves. The other locations within this mesh are connected to their immediate neighbors through a lower diffusion coefficient.

As described in this example, a comparison between pairs of locations whose relative positions approximate the dip is provided. Given a location P, certain pixels in 2-D (or voxels in 3-D) within a prescribed radius are selected (e.g., by a user or other means). This is due to the inherent limitation of a discrete dip: only a finite number of dips may be accurately captured as outlined above. For the sake of efficiency, the user-defined radius limits the search for dip-guided connections. Moreover, skipping immediate neighbors means that the trace to which location P belongs may not be linked to an immediately adjacent trace. So the propagation may not reach all traces if the connections are only due to dip representation. Therefore, a second type of connection is introduced—referred to as a "fill-in" connection, which connects grid points to their immediate neighbors. The procedure thus outlined describes how to build a discrete non-isotropic Laplace operator. To distinguish between the two types of connections, it suffices to set different diffusion coefficients for each: high coefficient (e.g., 1) for the dip connections, and a low coefficient (e.g., $\frac{1}{10^6}$) for the fill-in connections. Hence, the boundary value problem involves a Laplace equation (the PDE), and the boundary values are provided by the initial trace. The solution to this problem is the labeled volume.

Then, the labels 412 are combined with the vector volume based on the connectivities to provide a labeled volume 420, as shown in FIG. 4C. The labeled volume 420 represents the subsurface region being represented by this model. In this labeled volume 420, the labels are propagated throughout the volume to provide the different colors of red, orange, yellow, green, blue and violet, which are associated with the appropriate labels. The labels change more in the direction orthogonal to the vector orientation. That is, the labels change along the gradient L direction as compared to the F direction, which is indicated in the scale 422.

As an exemplary embodiment, the label propagation method may be performed by a vector integration method. In this method, it utilizes the gradient of the labeled volume being orthogonal to the vector field as part of the boundary value problem (BVP). First, similar to the previous method, an initial trace 412 and associated labels are determined, as illustrated in FIG. 4B. Then, dips may be determined in a seismic trace through known methods, such as using trend analysis, as discussed above. The dips are transformed into oriented vectors 414, such that the oriented vectors point away from the initial trace. The desired result is such that the gradient of the labeled volume L is orthogonal to the vectors, which may be expressed in the following equation (e24):

$$\nabla L \cdot \vec{F} = 0 \qquad (e24),$$

where L denotes the desired labeled volume, $\nabla L$ is the gradient of the labeled volume, and F is the vector field obtained from orienting a measured dip field. This is a more accurate representation of dip than the discrete approximation used in the harmonic interpolation method above.

For this embodiment, FIG. 4B outlines the initial boundary value problem before the solution is computed; and FIG. 4C depicts the result with the solution (L) shown. The vector field, denoted F and depicted as 416 and 422, provides the dip connection suggestions. The labeled volume, denoted L, is shown in color and the direction of the gradient of the labeled volume L (denoted $\nabla L$ at location P and depicted by 422) is shown to be perpendicular to the vector field. In addition, FIG. 4B depicts a graph 410 of a vector field 416 for a subsurface volume shown as black arrows, as well as an initial trace 412 with assigned labels depicted with colors that vary from red to yellow to green to blue.

The equation (e24) is applicable to 2-D and 3-D problems and discretization schemes that simplify the solution of the problem exist. To gain efficiency (e.g., to achieve computational complexity for solving this problem that is linear in the number of grid points), the orientation of the dip vector is determined to be away from the initial trace. In this manner, both 2-D discretizations and 3-D discretizations may lead to updating a trace by only looking back at previous traces (without having to loop back to other traces as in a diffusion problem, for example). The result of this problem is a triangular matrix with few non-zero entries, which is the same as the number of pixels or voxels. This linear system is then solved in linear time using any standard triangular solver. For even greater efficiency, several parallelization schemes may be utilized exploiting multiple central processor units (CPUs) or graphics processor units (GPUs).

In one or more embodiment, different label propagation methods may be utilized together to enhance the process be providing different models or being combined to enhance the result. For example, a seismic image may be utilized with one or more label propagation techniques. The method may include obtaining a trace (e.g., a seismic trace), which may be accessed from memory or generated from measurement data through the techniques know to those skilled in the art. Then, one or more seismic traces are selected from the image, which may include a single seismic trace or may include multiple seismic traces. Once the seismic trace is selected, the labels are assigned to the seismic trace. Then, labels may be propagated to the vector volume using one or more techniques, as noted above. For instance, the Laplace equation and diffusion equations may be utilized to propagate the labels through a vector volume with the associated trace. Alternatively or in addition, another technique, such as vector integration, may be utilized to propagate labels in the vector volume with the seismic trace. Then, the labeled volume may be applied to the seismic image. The application of the labeled volume to the seismic image may involve thresholding. If one or more labeled volumes are generated, the different labeled volumes may be combined by a mathematical operation or one of the labeled volumes may be selected by a user. Regardless, the resulting labeled seismic image may be utilized for other processes, such as horizon extraction or it may be utilized in the identification of hydrocarbons within the subsurface region.

Figure 5A:
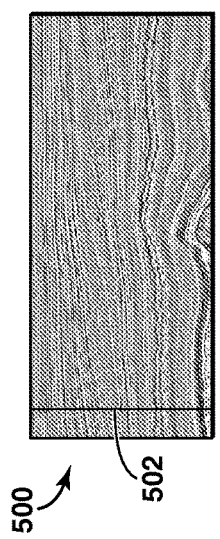
FIGS. 5A to 5D illustrate graphs associated with the label propagation stage in accordance with an exemplary embodiment of the present techniques.
Figure 5C:
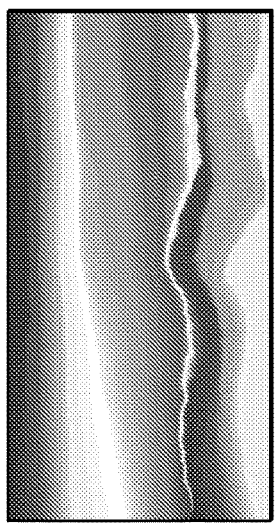
Figure 5B:
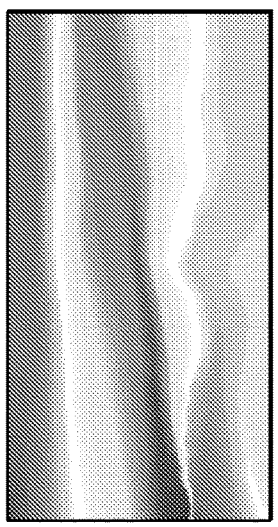
Figure 5D:

This process is further explained in FIGS. 5A to 5D. In this exemplary method, an initial seismic image and vector volume are obtained and a seismic trace 502 is identified, as shown in FIG. 5A by the seismic image 500. In this seismic image 500, a seismic trace 502 is identified for use in the method, which may be from a user's selection or an automated process. The Laplace equation is then utilized to propagate the labels through a vector volume with the associated trace, as shown in labeled volume 510 of FIG. 5B. Additionally, the vector integration method is utilized to propagate labels in the vector volume with the seismic trace, as shown in labeled volume 520 of FIG. 5C. Then, the labeled volumes are combined and applied to the seismic image to create a labeled image 530, as shown in FIG. 5D. This labeled image 530 may be formed by blending the seismic data in the seismic image with the labeled volume. Beneficially, the blending of these volumes may further enhance modeling of the volume by providing an effective image for the assigning of geologic properties.

In one or more embodiments, use of two or more label propagation methods may include different variations to enhance the process. For example, the process may include three, four or more label propagation methods, which are utilized to provide the labeled volume. The blending of different label propagation methods may include averaging the different labeled volumes together to form an average or may involve applying different weights to the different labeled volumes. For instance, the first label propagation method may be weighted 40% and the second label propagation method may be weighted 60%. The weighting may be adjusted based on the uncertainty and/or confidence associated with the different label propagation methods.

In other embodiments, the different label propagation methods may be utilized for different portions of the resulting labeled volume. That is, one label propagation method may be used for a first portion to form a first labeled volume and a second label propagation method may be used for a second portion to form a second labeled volume. These different labeled volumes may be combined to form the labeled propagation volume. These different label propagation techniques may be utilized for the different portions of the volume because of computational efficiencies of certain methods, uncertainty and/or confidence associated with the different label propagation methods.

As noted above, the label propagation stage may include extracting different surfaces from the vector field and a seed point (e.g., one or more traces). However, extracting many surfaces simultaneously may be achieved substantially more efficiently with the use of the label propagation stage. In addition to efficiency, the simultaneously extracted surfaces are also topologically consistent, i.e. they do not intersect.

The labeled volume is an implicit representation of the surfaces because the 3-D coordinates of each surface point is computed from the labeled volume. An alternative to such a representation is to explicitly store surface descriptions, which may be performed with a stack of surfaces, which is described further below.

Beneficially, the efficient solution provided by the label propagation method enhances the operation of the process by enhancing efficiency. For example, the label propagation method enhances the efficient calculation of horizons, which is described further below. The label propagation enables the selection of a label or point to read the label and find all other locations with the same label. Further, the labels are not limited to the selection of surfaces as peaks, troughs or zero-crossings, but provides the ability to select surfaces where no special seismic events exist. This is especially desirable where the input data is not a seismic attribute but, for example, a picture of a scanned line. This provides the unique ability to interpret multiple types of data (e.g., seismic amplitudes and scanned lines) and combine the results in a consistent manner to produce a geologic model. Moreover, the label propagation method enables efficient full-volume flattening, which has the labeled volume as a map between the original input data volume and the flattened data domain (where surfaces appear as horizontal lines and the input data conforms to this new geometry). Moreover, the label propagation method provides efficient calculation of geometric attributes (e.g., unique proxies for relative thickness and isochron, may be obtained as the magnitude of the gradient of the labeled volume).

In addition to efficiency, the label propagation provides flexibility. For example, the label propagation method provides registration of volumes in different domains. That is, the various data sets do need not have the same characteristics (e g, dimension, sampling, etc.), and may even be from different geographic locations. The labeled volumes for each data set from the label propagation method can be used to translate a surface in one volume to a surface in another volume. Further, this may be utilized for different scales of grid or data (e.g., controlled source electromagnetic and seismic data). Therefore, cross-volume registration based on surface correspondence may be provided and realized.

The horizon extraction stage, which is noted in the block 110 of FIG. 1 and further below in FIGS. 11A and 11B, may be implemented through various methods to determine the surfaces for the subsurface region. The horizon extraction stage may include the use of the label propagation stage (using a labeled volume) and/or the vector estimation stage (using a vector volume from the curve integration for extracting ridge curves and surface integration for extracting ridge surfaces). The data utilized as input into this stage may include a vector volume or a labeled volume, which may be the output from the vector estimation stage and/or the label propagation stage, respectively. The output of the horizon extraction stage is a subsurface model.

The horizon extraction stage may include various steps to generate the subsurface model. For instance, surfaces may be obtained for a volume from known techniques or the methods noted above. Then, the process of extracting the horizons may be performed, which may include ordering the surfaces. This organizing the surfaces may include stacking the surfaces or other suitable methods, which are described in U.S. Patent Application Pub. Nos. 20100149917; 20110048731; 20100161232; and 20110002194; publications, such as Zeng Zeng, Hongliu, Henry, S. C., and Riola, J. P., 1998, Stratal slicing, part II: real seismic data: Geophysics, vol. 63, no. 2, p. 514-522.

As an example of one organization method, the label volume may be a stack of surfaces. For this example, each surface is defined such that no two surfaces intersect one another, and that each surface has a unique depth value z at any location (x,y). The different surfaces may be numbered from 1 to n (where n is the total number of surfaces) and then these surfaces may be ordered according to increasing (or decreasing) depth values. The resulting order is a stack of surfaces, which may be denoted as SOS. The representation yields a stacked labeled volume, where the x and y coordinates are the same as in the original volume but where the third coordinate represents a surface number s. Thus, the point (x,y,s) in the stacked labeled volume stores the depth value z at a real location (x,y) of surface number s. If s is a fractional number, then the depth value may be interpolated between the depth values of surfaces with the two nearest integer values (e.g. ceiling(s) and floor(s)).

As may be appreciated, the stack of surfaces may be formed in the label propagation stage by choosing a granularity (e.g., how many surfaces intersect the initial trace). In fact, in certain embodiments, this process may be utilized following the label propagation stage or integrated into the label propagation method. That is, as the labels are propagated to nearby traces, the depth or z values may be captured in the appropriate slots in the labeled volume to convert it into a stacked labeled volume (a stack of surfaces or SOS). It is not necessary to maintain the label traces except for immediate neighbors to the front of propagation. As a result, a portion of the labeled volume may be stored, which may enhance the process by reducing storage requirements in memory and computing read write cycles for additional data.

As an example, for each surface s, a collection of 3-D points (x,y, SOS(x,y,s)) may be obtained. At each of those points, each surface s may be written to memory in an initially empty labeled volume L of identical size to the volume of the vector field or seismic image. Then, missing values in labeled volume L with the surfaces may be interpolated.

Once the stacked labeled volume is created, the volume may be verified and corrected. That is, corrections to the surfaces in a particular stacked labeled volume may be performed. In one embodiment, these corrections are represented by perturbations to the surface numbers. A surface s, which is to be corrected, has its constituent points retrieved by cycling through the possible x and y locations and extracting 3-D points according to (x,y, SOS(x,y,s)). If, instead, the 3-D points are extracted according to (x,y, SOS(x,y,s+p(x,y))), then corrections may be implemented. The term p(x,y) is the perturbation to the surface number s at location (x,y). Thus, the resulting depth values over the whole surface may be selected from many different surfaces within the stack of surfaces. A perturbation mapping for each surface s is referenced as p(x,y,s).

In general, these perturbations could be stored in a volume p(x,y,s) of the same size as stacked labeled volume (e.g., stack of surfaces SOS). A 3-D point may then be extracted according to (x, y, SOS(x,y, s+p(x,y,s))). In another embodiment, volume p(x,y,s) may be compressed and may not be a full volume. That is, the representation of the perturbations may be reduced by encoding the locations of zero or no perturbations.

To obtain volume p(x,y,s), various techniques may be utilized. In one embodiment, a user may select points on a single surface, as surfaces to be corrected. If those points are not on the same surface (e.g., having surface number s), then volume p(x,y,s) is computed there so that s_ref+p(x,y,s)=s (x,y), where s(x,y) is the surface number at the user selected point (x,y,z), and s_ref is the reference surface number that is utilized to calculate the perturbations. By using this approach, the user may effectively provide a sparse description of p(x,y,s). Interpolation and/or extrapolation of those sparse locations may complete the definition of the perturbations. Several interpolation and/or extrapolation schemes may be utilized, such as linear, harmonic (e.g., solution to Laplace's equation), nearest neighbor, etc.

As the stacked labeled volume may become too large to compute or store as a single file, it may be useful to divide the operation and storage between multiple computers. Further, this division of the stacked labeled volume operations may also be useful when the stacked labeled volume not adequately represent an area of interest (e.g., when the footprint is not a rectangle). Such a division of the stacked labeled volume may be referred to as a multi-stacked labeled volume. Thus, it may be beneficial to break the computing operations and representing surfaces into a collection of stacked labeled volumes, which may be referred to as multiple stacks of surfaces (MSOS).

The collection stacked labeled volumes may be utilized in similar operations as the stacked labeled volume, except that has to include a description that defines how surfaces in one stacked labeled volume merge or are associated with surfaces in another stacked labeled volume. This aspect may be managed by defining pairs of local perturbation maps that only cover the seam between adjacent stacked labeled volumes.

As an example, a first stacked labeled volume and a second stacked labeled volume may be combined to form a collection of stacked labeled volumes. In a particular embodiment, each surface in the first stacked labeled volume at the seam (e.g., each curve) may be examined. Then, one of the surfaces in the second stacked labeled volume is selected at the seam. This selection is limited by the constraint that the ordering relation of the first stacked labeled volume and the second stacked labeled volume is maintained (e.g., if first surface is above second surface in the first stacked labeled volume, then the corresponding surfaces in the second stacked labeled volume also satisfy that relationship). Following this, as a pair of local perturbation maps are computed or defined with one for the first stacked labeled volume and another for the second stacked labeled volume. The computed corresponding pairs of surfaces are made to be a single surface at the seam and the perturbations smoothly revert to the original surfaces as the surfaces move away from the seam. Thus, if surface s in the second stacked labeled volume is modified to continue surface s' from the first stacked labeled volume at the seam, then the perturbation map smoothly morphs surface s into the curve of surface s' approaching the seam.

In one embodiment, the surface curve at the seam is computed as the average of curves from the corresponding surfaces from each of the first stacked labeled volume and second stacked labeled volume being combined. To perform this averaging, one may pick a trace on the seam and compute the curves at regular intervals that pass through the trace. Then, curve averaging may be performed.

In an alternate embodiment, the surface curve at the seam may be computed independently. For example, vectors may be obtained at the seam surface and then the label propagation stage may be executed to produce a local stack of curves. Each of these curves may then be propagated into each of the two stacks. As an example, a point on a curve may be selected and then the surface that this point defines in first stack may be calculated. Then, the surface orthogonally to the curve may be determined. This process may be repeated for other stacks.

As yet another method that may be utilized for the horizon extraction stage, this stage may include a vector integration for extracting ridge curves method. This method may include determining a ridge curve that passes through a local maximum including two or more computational methods, such as (i) approximating a tangent field and (ii) numerical integration. The approximation of the tangent field may be performed once on the data volume and the resulting vector field may be used to compute several ridge curves. The vector estimation stage describes one method to approximate the tangents to the ridge curves, but numerous other methods may be utilized. In particular, the vector estimation stage provides a controllable method that provides an enhancement to the estimation and other techniques.

The second approach to determine the ridge curves involves performing a numerical integration. This process begins with the selection of a seed point. The seed point may be selected manually or through an automated process, which is known in the art. This seed point is then expanded in the tangent direction according to a step size. This expansion continues until a stopping criterion is satisfied. The resulting sequence of points constitutes the approximation of the ridge curve. Beneficially, this approach computes the local tangents in an enhanced manner as compared to conventional methods. That is, the approximate tangent field is utilized to compute a local neighborhood ahead of the current point. Then, the neighborhood is analyzed and an appropriate tangent vector is selected. Thus, the tangent field is used as a guide and the curves are not necessarily dependent upon the tangent field.

For example, a point P and an approximated tangent $\vec{t}_0$ may be obtained. For the point P and approximated tangent, the neighbors Q, which are defined in equation (e25), may be collected:

$$N=\{Q:(P-Q)\cdot\vec{t}_0>0, \|P-Q\|<r\} \qquad (e25);$$

where r is the radius of the neighborhood N and, as noted above, N is neighborhood, while P and Q are spatial locations.

The weights at those neighbors may be defined by equation (e26) as follows:

$$W(x,y)=W(Q_x,Q_y) \qquad (e26).$$

The weights may be transformed so that the weights are positive according to equation (e27):

$$W(x,y)=W(x,y)-\min(W) \qquad (e27);$$

where W, as noted above, is the weight at spatial location (x,y)

The ridge tangent at its current point may be computed by computing the weighted average of the vectors joining point P to its neighbors in N as follows in equation (e28):

$$\vec{t}_{ridge} = \begin{bmatrix} \sum_{Q \in N} W(Q_x, Q_y) \frac{(Q_x - P_x)}{\|Q - P\|} \\ \sum_{Q \in N} W(Q_x, Q_y) \frac{(Q_y - P_y)}{\|Q - P\|} \end{bmatrix};$$ (e28)

where $\vec{t}_{ridge}$ is the ridge tangent at the current point.

This solution provides half of the curve (e.g., the "right" half) because the approximated tangent is oriented that direction. The other half of the curve (e.g., "left" half) is obtained in a similar manner by considering the negative of the approximated tangent, which is expressed in equation (e30):

$$\vec{t}_0 = -\vec{t}_0$$ (e30).

Figure 6:
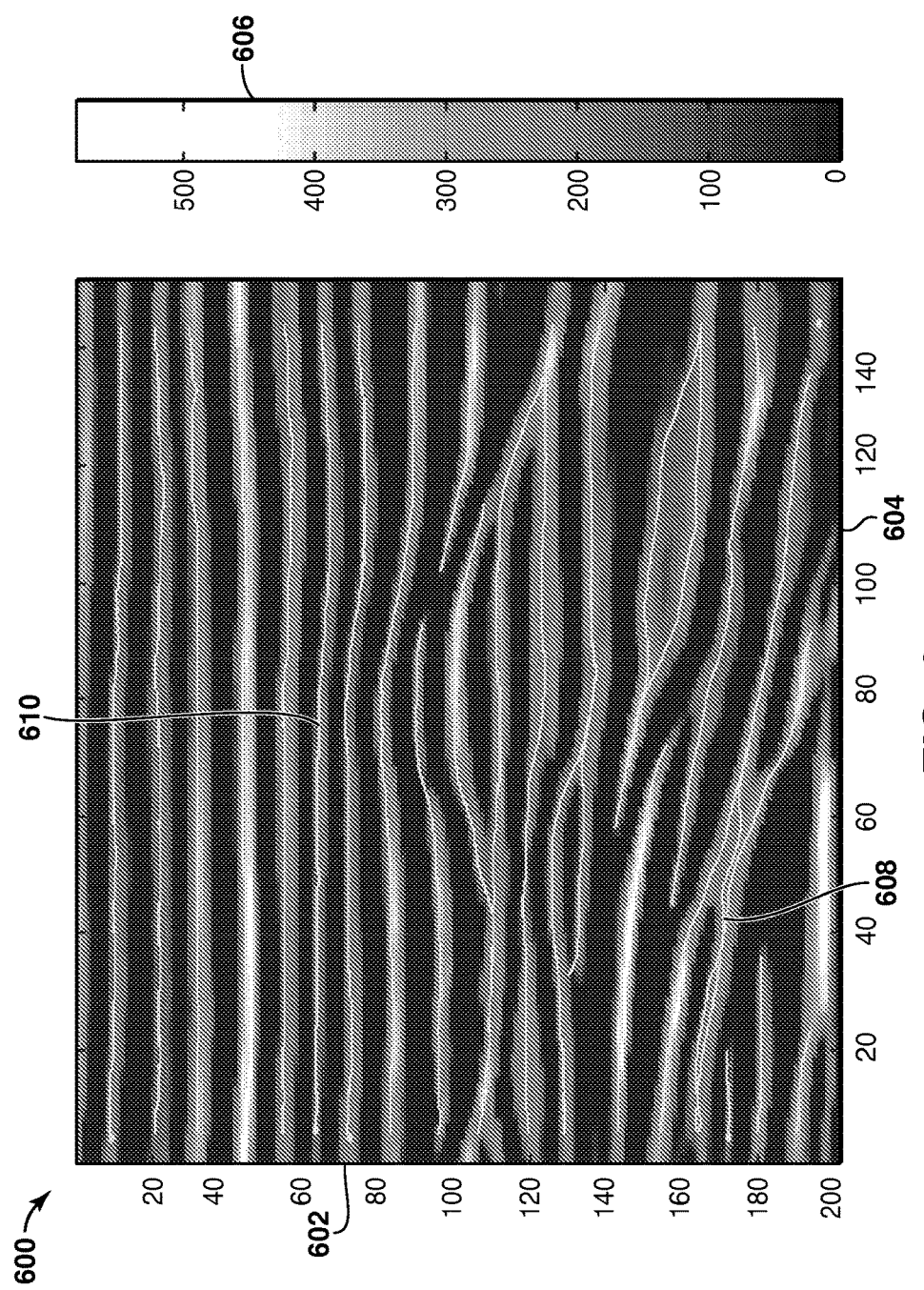
FIG. 6 illustrates a graph associated with extracting ridge curves using curve integration in accordance with an exemplary embodiment of the present techniques.

As an example, FIG. 2 along with FIG. 6 may be utilized to describe an implementation of this method. As noted above, FIG. 2 is an exemplary graph 200 of a vector field for a portion of the subsurface volume, which includes various troughs (e.g., blacks regions) and peaks (e.g., yellow, orange and red regions). These ridge tangents may be computed by equations above. Beneficially, this calculation of the ridge tangents provides another process of calculating the ridge curves by using an existing vector field or directly from the data volume.

Then, the computed vector field is utilized to compute a more accurate local tangent to the ridge curve and perform the numerical integration. For this example, the stopping criterion is a negative data point (e.g., as only positive amplitudes are shown in FIG. 6). FIG. 6 is an exemplary graph 600 of an amplitude data with ridge curves for a portion of the subsurface volume, which includes various troughs (e.g., blacks regions) and peaks (e.g., yellow, orange and red regions). In this graph, the depth of the subsurface volume is shown along the axis 602 in units of sample number and distance is shown along axis 604 in units of trace number. Further, the intensity of the amplitude is shown in arbitrary units in scale 606, which has the color black associated with troughs and the colors red, orange and yellow associated with increasing magnitude from red to orange to yellow. The axis 602 and 604 may be similar to that of FIG. 2, noted above. As shown in this graph, various local tangents, as represented by the tangents of the curves 608 and 610. Although different seed points initiate different ridge curves, many ridge curves overlap or are in close proximate to other ridge curves. This result is expected because each curve is directed toward a local maximum as a result of the calculation of the ridge tangent. This provides additional benefits in that it provides additional insights into the reflections, such as estimates how reflections behave, where they terminate, how they thicken and thin, their topological connectivity, etc.

Unlike other conventional methods, which rely upon the tangent field, the present technique largely ignores the tangent field during the computation of the local tangents during the integration step. The tangent field is merely used to guide the estimation of the local tangent by providing a notion of what is "in front" of the current point. The neighborhood "in front" of the current point during the curve integration can also be restricted to a cone in front of the point oriented by the local tangent. In particular, the neighbor can be expressed as equation (e31):

$$N = \left\{ Q: \frac{(P-Q)}{\|P-Q\|} \cdot \vec{t}_0 > \cos(\alpha), \|P-Q\| < r \right\};$$ (e31)

where $0 \leq \alpha \leq \pi/2$ denotes the angle at the apex of the cone and r is the height. This approach uses the data directly and may recover from large errors in the initial tangent field. Additionally, the size of the cone is a parameter that can adjust the smoothness of the resulting curves, as well as their sensitivity to data noise.

Yet another method of performing the horizon extraction may include surface integration for extracting ridge surfaces. This method may include determining a ridge surface that passes through a seed point, such as a local maximum, which is similar to computing the ridge curves in two dimensions. First, a tangent plane is computed at each location in the volume, which can be performed with any known methods. For instance, the calculation of the tangent plane in the vector estimation stage. Similar to the calculation in 2-D, the field of the tangent plane normals are used as a guide to compute the next point in the surface. The procedure begins at a seed point (x,y,z), collects the x and y neighbors that can be visited and have not been visited yet. Then, a z value is computed for each neighbor in a manner described below. The stopping criterion may include no additional neighbors are available, a threshold for neighbors, a specific window for neighbors, do not visit an x,y location more than one (e.g., to avoid self-overlapping curves), or the like. Beneficially, this method computes a horizon that may be utilized in the interpretation of the data.

As an example, location P is a point on the x-y grid, such that at least one of its immediate eight neighbors is part of the integral surface. One of the neighbor points may be selected and references as $Q = (Q_x, Q_y, Q_z)$. If vector u is defined by equation (e32):

$$\vec{u} = P - Q$$ (e32);

and $\vec{w}$ is defined as the projection of vector $\vec{u}$ onto the approximate tangent plane at location Q. Then, the analogous neighborhood of P in 3-D may be defined similarly to the 2-D case above as satisfying the constraint equation (e33):

$$N = \left\{ Q: \frac{(P-Q)}{\|P-Q\|} \cdot \vec{w} > \cos(\alpha), \|P-Q\| < r \right\}.$$ (e33)

As in the 2-D example (which is noted in equation (e31)), the average vector $\vec{a}$ between the tangent plane Q and the collected points weighing each vector by the data value is computed. Analogously, the vector $$\frac{\vec{a}}{\|\vec{a}\|}$$

is the updated approximation to the directional derivative of the surface, so the z value at location P should be the z value at tangent plane Q incremented by the z component of that vector, which is represented by equation (e34):

$$P_z = Q_z + \frac{a_z}{\|\vec{a}\|}. \quad (e34)$$

Further, curves and surfaces from trend tensors may be calculated by obtaining tangent vectors or tangent planes from the trend tensors. As an example, a seed point P may be provided. With the seed point, an integration of the tensor field may be performed until the quality of the measurements (e.g., the tensor) deteriorates below a user-specified threshold. In 2-D, the integration of the tensor field includes classical curve integration whereby the next point on the curve is chosen by examining the last point, computing the tangent there using the tangent field, and advancing in the unit tangent direction by a predefined step size. This method of computing the tangent field manages the noise. Examples of iso-curve tensor applications in two dimensions are shown in FIG. 7.

Figure 7:
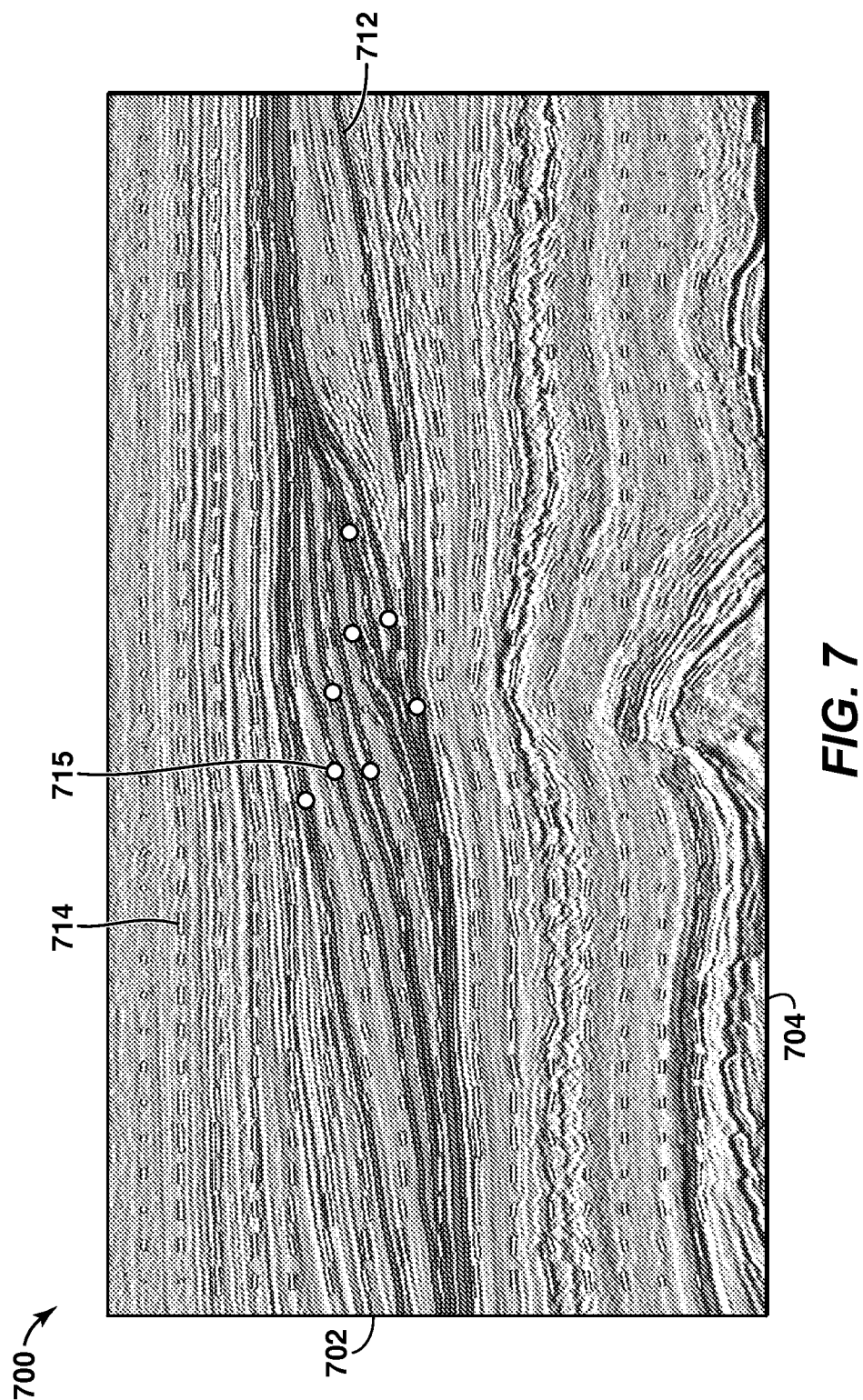
FIG. 7 illustrates a graph associated with extracting an iso-curve tensor in accordance with an exemplary embodiment of the present techniques.

FIG. 7 illustrates a graph associated with extracting iso-curve tensor in accordance with an exemplary embodiment of the present techniques. In particular, FIG. 7 is an exemplary graph 700 of a seismic image for a portion of the subsurface volume. In this graph, the depth of the subsurface volume is shown along the axis 702 in units of sample number and distance is shown along axis 704 in units of trace number. Further, the confidence values, such as confidence value 714, are shown as a multitude of yellow segments, each of which that denotes orientation and unitless relative magnitude (through its angle and length) but omits direction, while the calculated curves are indicated by the longer red lines, such as line 712, and seed points 715 are shown in green. As shown in this graph, the selection of the seed point may be utilized in the generation of a horizon (e.g., curves).

In 3-D, the integration includes computing the height value, or z-value, of the surface boundary neighbors. With a neighbor Q of a surface boundary voxel P, the vector $\vec{v}$ in the x-y plane that connects P to Q is computed. Then, the tangent plane at voxel P is utilized to compute the directional derivative value in the direction of $\vec{v}$ and it is used to increment the z-value of voxel P. The result is that the z-value of Q is obtained. The integration may be stopped in areas of low confidence for certain workflows.

Also, given a stack of surfaces SOS, selection of the surface number s in order to extract a 3-D surface may be sufficient. If a perturbation map p(x,y,s) is available, as noted above, then the surface number should be constructed with respect to that map. In other words, given a point (x,y,z) find s such that SOS(x,y, s+p(x,y,s)) is closest to z.

Figure 8:
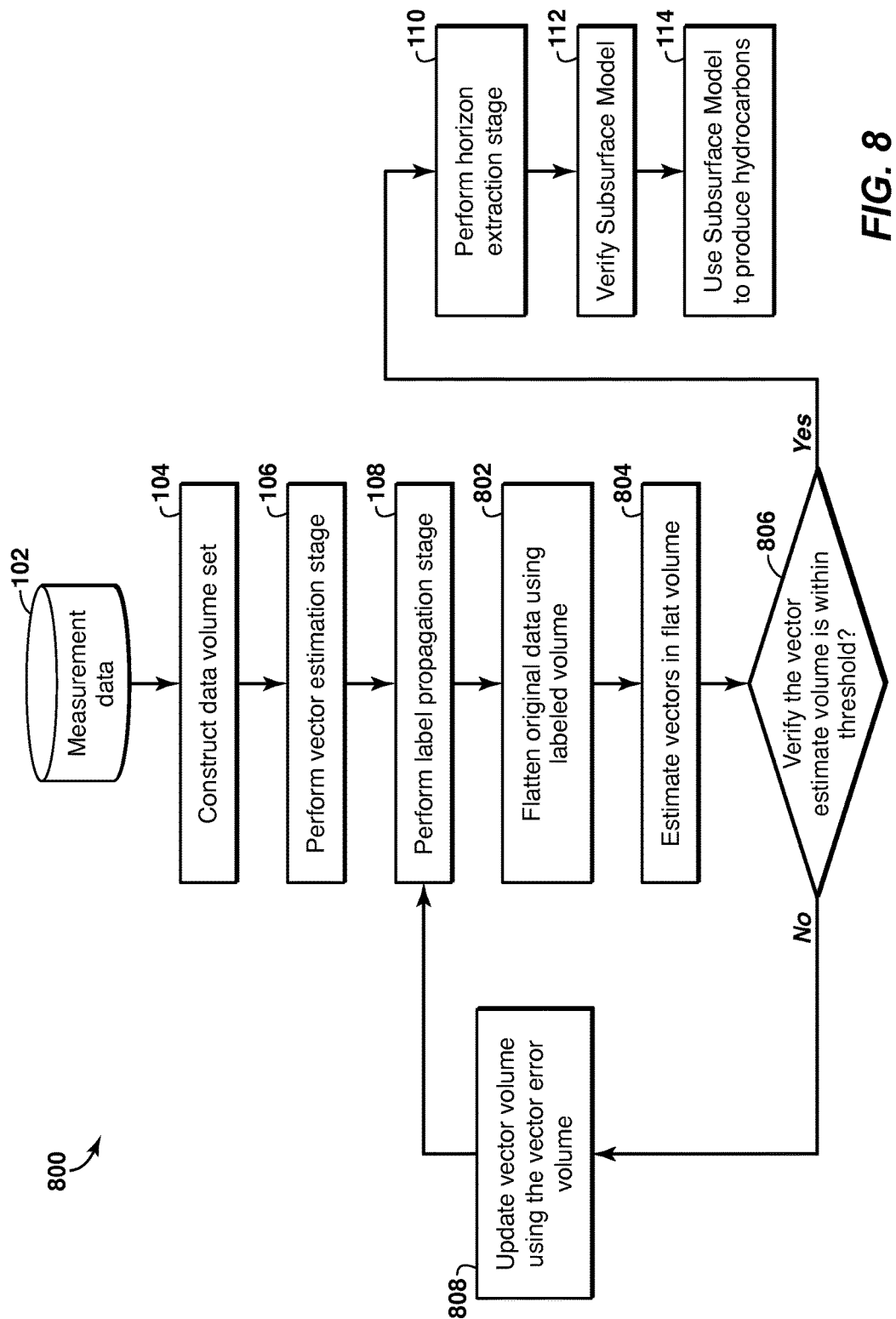
FIG. 8 is an alternative flow chart for generating a subsurface model that includes updating of the vector estimation stage in accordance with an exemplary embodiment of the present techniques.

As a further enhancement to the subsurface model construction process, certain embodiments may update the vector estimation stage as part of the subsurface model generation process, as shown in the exemplary flow chart 800 of FIG. 8. That is, this flow chart includes additional steps utilized to update the vector estimation stage using a flattened domain. In this flow chart 800, various stages may be implemented from the flow chart 100 of FIG. 1. That is, the process includes a data preparation stage, which includes blocks 102 and 104, vector estimation stage, which includes block 106, label propagation stage, which includes block 108, and a horizon extraction stage, which includes block 110. Further, the resulting subsurface model may be verified and utilized to produce hydrocarbons as shown in blocks 112 and 114. These previously discussed blocks may operate in a similar manner to the discussion above. However, in this flow chart 800, the labeled volume is subjected to a vector verification and updating stage, which includes blocks 802, 804, 806 and 808.

The process flow begins with a data preparation stage, which includes blocks 102 and 104. As noted above, these blocks involve constructing a data volume set from the measurement data. Then, as noted in block 106, the vector estimation stage is performed, which may include the techniques noted above. Following the formation of the vector volume, the label propagation stage, which includes block 108 is performed in a manner similar to the process noted above.

Once the labeled volume is constructed, the vector verification and updating stage, which includes blocks 802, 804, 806 and 808, is performed. At block 902, the labeled volume is utilized to flatten the data volume. The flattening of the data volume may include mapping the data onto the surfaces defined by the normal vectors in the label propagation stage. Then, at block 804, vectors may be estimated in the flattened data volume. This vector estimation may involve the different processes noted in the vector estimation stage to form a flattened data volume based on a stack of surfaces obtain from the vector volume and then generate an estimate of errors (e.g., vector error volume). That is, the process may include computing vectors in the flat domain, which are correction vectors that may be formed into a vector error volume. The vector error volume may be the deviations from the horizontal vectors and may be applied to the current estimate of the vector volume to further enhance the volume, which is performed in block 808.

Once the vector error volume is computed, the vector error volume is determined whether it is within a threshold, as shown in block 806. The process may verify if the error vectors are threshold (e.g., tolerance) or if a maximum iteration number has been reached. If the error vector volume is within the threshold, then the process may perform the horizon extraction stage, verify the subsurface model and use the model, as set forth in blocks 110, 112 and 114. If the error vector volume is not within the threshold, then the process may update the vector volume with the vector error volume to form an updated vector volume, as shown in 808. The update of the vector volume may include applying the error vector volume to the vector volume and storing the updated vector volume, which is utilized in block 108. Then, the process may perform the label propagation stage with the updated vector volume and produce a final stack of surfaces. Beneficially, the error vector may be determined for each sample (e.g., independently or as a local determination).

As an example, one or more embodiments may include computing vector, such as in block 106 of FIG. 1 or block 804 of FIG. 8. The method may include obtaining a data volume, wherein the data volume has a plurality of traces and each of the plurality of traces include a plurality of samples; obtaining a neighborhood criteria (e.g., neighborhood size and shape) to be applied at each sample of the data volume; then for each sample in the data volume, performing: (i) extracting a set of samples that comprise the neighborhood; (ii) assigning a coordinate to each sample in the set of samples; (iii) assigning a weight to each sample in the set of samples, wherein the weight is a function of the data value of the sample; (iv) calculating a modified polynomial fit (e.g., a linear regression) on the set of samples; (v) assigning a value to the sample based on the calculated modified polynomial fit; and storing the assigned values for each sample as the vector volume in memory accessible by a computer system.

In one or more embodiments, the method may include different approaches to compute the vectors. For example, the method may include calculating the weight as a function of the value at the sample (e.g., the calculation may include calculating the absolute value, an even power, etc.). The calculation may include subtracting the value associated with the sample from a maximum value, which may prefer low values (e.g., function is maximum threshold value (MaxValue) minus the sample value (Sample Value)), which may be used for troughs instead of peaks. In other approaches, the zero-crossings may be utilized to calculate the weight of the sample (e.g., weight function is exponent of the sample value (exp(SampleValue)). Alternatively, the weight may also be calculated based on the location of the sample in the data volume, which allows manual intervention in some parts but not in others. Further, the method may include calculating the modified polynomial fit comprises calculating a modified polynomial fit on the set of samples and/or the calculation may include incorporating the weight of each sample in addition to the coordinates of the sample.

As yet another example, the method of modeling the subsurface is described. The method may include obtaining measurement data in a data volume associated with a subsurface region; computing initial vector estimates for the data volume to form a vector volume; flattening at least a portion of the data volume based on the vector volume; computing an error estimate based on the flattened at least a portion of the data volume for each sample; determining whether the error estimate is within a threshold; updating the vector estimates in the vector volume based on the computed error estimates, if the threshold is not satisfied; and one or more of storing the vector volume in memory accessible by a computer system and displaying the vector volume on a display accessible by a computer system, if the threshold is satisfied. The method may include repeating certain steps (e.g., the flattening the at least a portion of the data volume; computing vector estimates; determining whether the error estimates are within a threshold; updating the vector estimates) with the updated vector estimates, if the threshold is not satisfied.

Further, in other embodiments, the iterative update of vectors may be performed based on localized operations. In particular, the predicted data volume may be a flattened version of the volume, but only restricted to a portion of the volume (e.g., one or more areas or regions of the original volume). This is may be preferred because localized measurements are more efficient (e.g., a well-defined flattening operation), which does not involve the difficulties related to thinning and thickening of geologic packages in full volume flattening. In this embodiment, therefore, small neighborhoods (e.g., squares in 2-D or cubes in 3-D) are first extracted. For each such neighborhood, the current estimates of the vectors are used to build a set of local surfaces (restricted to the neighborhood). Then, the data is flattened (only for that neighborhood) and vector estimates are computed on the result. These estimates constitute error estimates for the center of the neighborhood. The procedure is repeated for each of the neighborhoods until the locations in the original data volume are covered (except possibly near the edges of the data volume). This constitutes the error estimation step. The remaining steps in the process are as similar to the previous embodiments.

In another embodiment, the data prediction is full volume flattening and the error estimation is a user driven process. Specifically, a user may interpret a surface in the flattened domain which is then used to estimate errors in the vectors which the surface encompasses. Alternatively, the user may interpret a surface in the original data volume instead of the flattened domain. In either case, the portion of the data volume for which error estimates exist is restricted to the areas where a surface is interpreted. As in other embodiments, the overall process is iterative.

As an example, one embodiment may include a method of modeling the subsurface that includes the steps of obtaining measurement data in a data volume associated with a subsurface region; computing initial vector estimates for at least a portion of the data volume to form a vector volume; computing an error estimate for at least a portion of the samples for which there is a vector estimate, wherein the error estimate is based on a comparison of a predicted data volume and the at least a portion of the data volume; determining whether the error estimate is within a threshold; updating the vector estimates in the vector volume based on the computed error estimates, if the threshold is not satisfied; and one or more of storing the vector volume in memory accessible by a computer system and displaying the vector volume on a display accessible by a computer system, if the threshold is satisfied. The predicted data volume may be based on flattening at least a portion of the data volume based on the vector volume or the model vectors that follow the surface (e.g., the vectors that are tangent to the surface); while the flattening at least a portion of the data volume based on the vector volume may include each of the surfaces at the same axial location. Further, the at least a portion of the data volume may include one or more surfaces in a label volume that are mapped to the at least a portion of the data volume or may include one or more extracted horizons that are mapped to the at least a portion of the data volume.

In other embodiments, the method may be utilized to extract local geometry from data. The method may include loading or obtaining measurement data; computing an initial approximation of the normal vectors (e.g., noted in the disclosure above for computing vectors); flattening the data or a portion of the data onto the surfaces defined by the normal vectors (e.g., similar to the disclosure related to FIGS. 10A and 10B); computing vectors in the flat domain (e.g., these are correction or error vectors); then, if the correction vectors are within tolerance or a maximum iteration number is reached, then the vector volume is complete; otherwise apply correction to vectors and repeat steps of flattening the data, computing vectors and determining whether the correction vectors are within tolerance or a maximum iteration number is reached. The computing the vectors may include computing the ridge tangents, computing trend tensors, computing structure tensors, and/or computing gradients of measurement data.

In certain embodiments, the method may include various features. For example, the method may include using the vector estimates in the vector volume to obtain dense set of surfaces (e.g., many samples have at least one surface passing through it or at substantially any location in the data volume is associated with a surface); wherein the measurement data include a plurality of traces, each trace having a plurality of samples and/or wherein the dense set of surfaces is a surface through each sample of each trace. Further, the flattening of the data volume based on the vector volume may include each of the surfaces at the same axial location (e.g., depth location or moving sample along a depth or time axis such that all samples associated with the same surface are at the same depth location or plane). The method may also include that the threshold is a maximum number of iterations or the threshold may be an error estimation threshold (e.g., the norm of the difference between the different vectors).

As may be appreciated, the embodiment may include a method that includes different data types, different uses for the vector volume and may be utilized to provide indications as to hydrocarbons within a subsurface region. For example, the method may include traces is a plurality of seismic traces (the seismic traces may be constructed from a seismic image or measured seismic data set); controlled source electromagnetic traces, and/or well log traces. The method may include utilizing the labeled volume to determine the location of hydrocarbons, wherein the labeled volume is created by the method mentioned above. Then, a well may be drilled to access the hydrocarbons and hydrocarbons may be produced from the well. The method may also be utilized to generate labeled volumes and extract horizons, which are described further below in the reference to discussion of FIGS. 10A, 10B, 11A and 11B, as examples.

Figure 9:
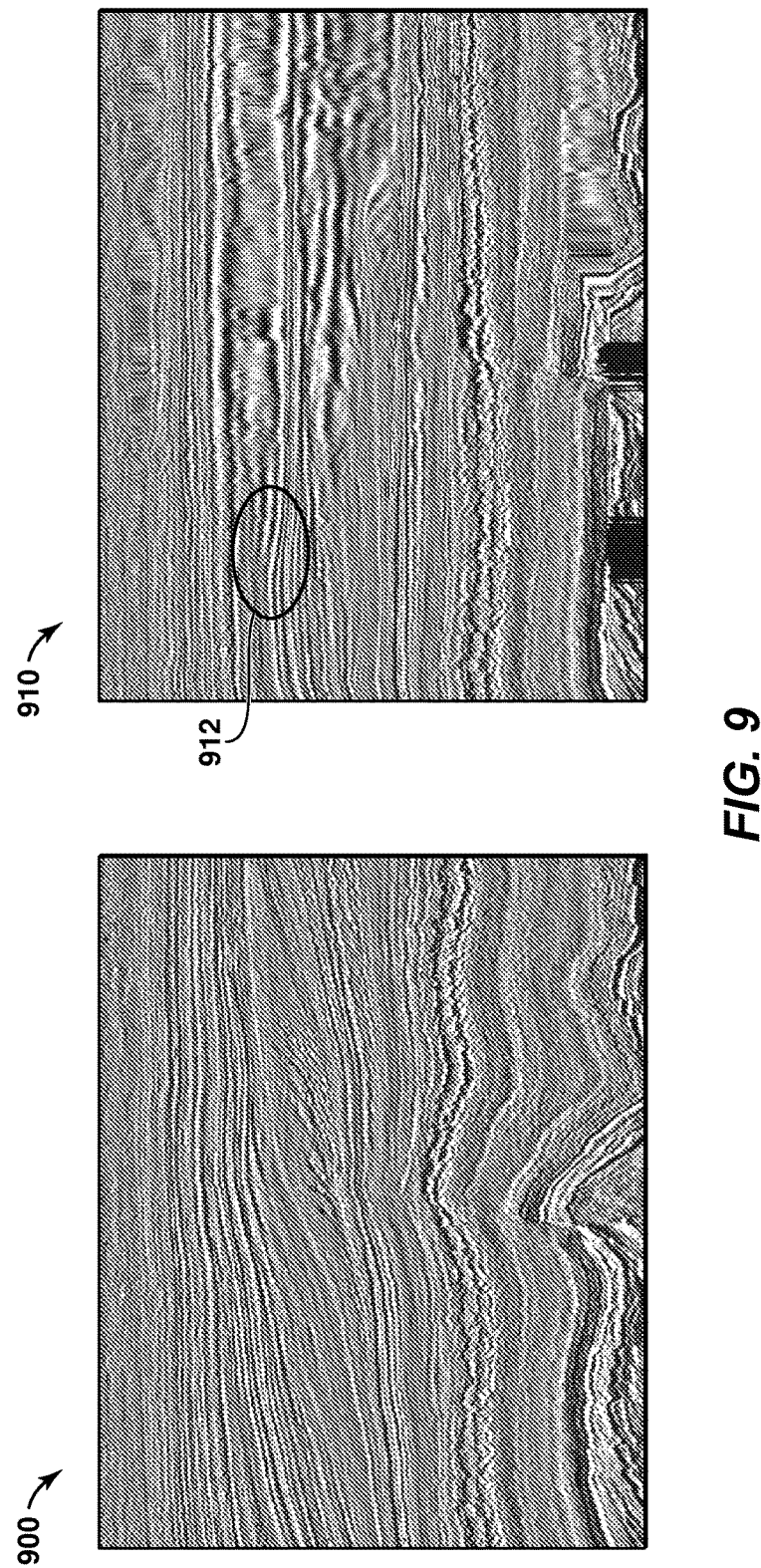
FIG. 9 illustrates graphs associated with a data flattening method in accordance with an exemplary embodiment of the present techniques.

As an example of the benefits of data flattening, FIG. 9 includes various graphs 900 and 910, which illustrates data slices subjected to a data flattening method in accordance with an exemplary embodiment of the present techniques. The graph 900 is an initial data slice that includes certain vector errors. Once this data slice is subjected to a data flattening method, the vector estimates in the flat domain capture the vector errors, as indicated in the marked area 912 in graph 910. As such, the flattening method may be utilized to indicate errors in the initial modeling, which may be utilized to enhance the model in an efficient manner.

Figure 10B:
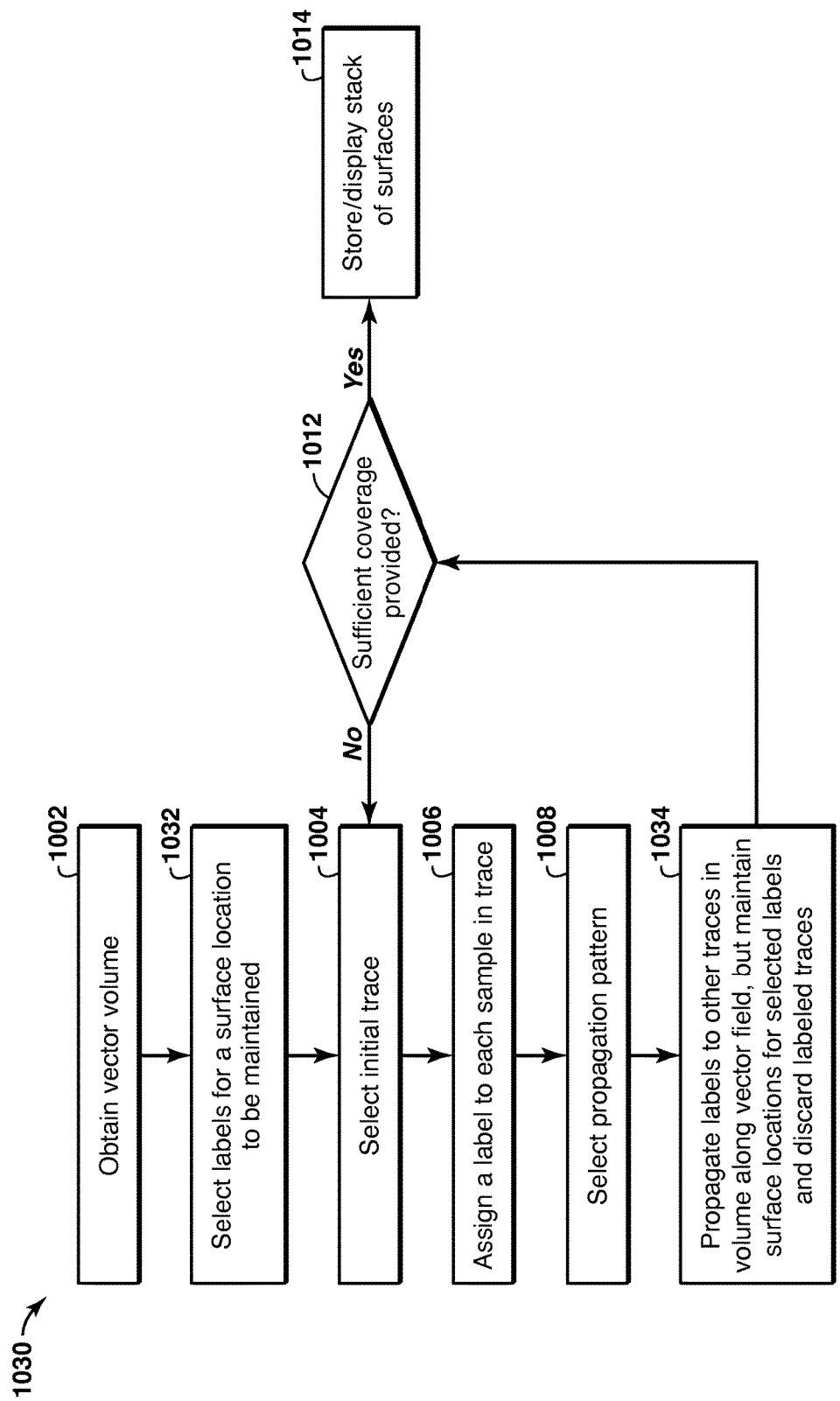

FIGS. 10A and 10B are flow charts for performing the label propagation stage in accordance with exemplary embodiments of the present techniques. These different embodiments may be utilized in the processes noted above, such as label propagation stage in block 108 of FIGS. 1 and/or 8. In particular, FIG. 10A is a flow chart 1000 involves selection of an initial trace to propagate the labels. The process involves determining labels for a trace, which is described in blocks 1002, 1004, and 1006 and then managing the propagation of these labels to the other traces in the volume, which is described in blocks 1008, 1010, 1012 and 1014.

The process begins by obtaining a vector volume, as shown in block 1002. The vector volume may be formed from the any of the different vector estimation stages noted above. Then, at block 1004, a trace within the data volume may be selected. This selection may include interacting with a user to select one or more of the traces in the data volume and/or an automated mechanism (e.g., set of instructions) configured to select certain traces based on coverage of the volume. Then, at block 1006, labels are assigned to each sample within the selected trace. This assignment of labels may include certain traces having the same label or each sample may receive a different label.

Once the labels are assigned to the selected trace, the process manages the propagation of these labels to the other traces in the volume, which is described in blocks 1008, 1010, 1012 and 1014. At block 1008, a propagation pattern is selected, i.e. the sequence of traces that will acquire the labels from a neighboring trace. The selection of the propagation pattern may be via interaction with the user and/or through an automated selection process. The automated selection process may be based on an optimization calculation of the volume from the trace selected and/or a determination based on the surfaces and/or slope of the volume. At block 1010, the labels are propagated to other traces in the volume based upon the propagation pattern. The propagation of the labels may include using the vector volume to guide the propagation of labels.

At block 1012, a determination is made whether the label propagation provides sufficient coverage for the volume. This determination may include determining if the nodes, grids or cells within the volume have a label assigned to them and/or if the labeled volume is within a specific threshold for having the labels assigned. That is, the sufficient coverage determination may include a manual review by a user or an automated process. For example, sufficient coverage may include all of the samples being provided with labels, at least 95% of the samples being provided with labels or at least 85% of the samples being provided with labels). If the coverage is not sufficient, then another trace is selected in block 1004 and the process is repeated with this new trace. However, if sufficient coverage is provided, then the labeled volume may be stored and/or displayed, as shown in block 1014. The storage of the labeled volume may involve storing the labeled volume in memory and/or the like. The display of the labeled volume may include displaying all or a portion of the labeled volume to a user via a display unit.

Similar to the flow chart 1000 of FIG. 10A, FIG. 10B is a modified flow chart that maintains certain surface locations. That is, this flow chart 1030 includes additional steps utilized to maintain or store certain surface locations. In this flow chart 1030, various stages may be implemented from the flow chart 1000 of FIG. 10A, which are referenced with the same reference numerals here for simplicity. That is, the process includes determining labels for a trace, which is described in blocks 1002, 1004, and 1006 and then managing the propagation of these labels to the other traces in the volume, which is described in blocks 1008, 1012 and 1014. However, in this process, certain surfaces are further managed, as shown in blocks 1032 and 1034.

Similar to the process of FIG. 10A, the process begins by obtaining a vector volume, as shown in block 1002. Then, at block 1032, one or more labels are selected for surface locations that are to be maintained. This selection of one or more labels may include interacting with a user to indicate which labels are to be maintained, or may be based on an automated process, which selects the label locations. At block 1004, a trace within the data volume may be selected. Then, at block 1006, labels are assigned to each sample within the selected trace.

Once the labels are assigned to the selected trace, the process manages the propagation of these labels to the other traces in the volume, which is described in blocks 1008, 1034, 1012 and 1014. At block 1008, a propagation pattern is selected. At block 1034, the labels are propagated to other traces in the volume based upon the propagation pattern, but the surface locations are maintained and the labeled traces are discarded. The propagation of the labels may include using the vector volume to guide the propagation of labels.

At block 1012, a determination is made whether the label propagation provides sufficient coverage for the volume. This determination may include determining if the nodes, grids or cells within the volume have a label assigned to them and/or if the labeled volume is within a specific threshold for having the labels assigned. If the coverage is not sufficient, then another trace is selected in block 1004 and the process is repeated with this new trace. However, if sufficient coverage is provided, then the labeled volume, which is a stack of surfaces, may be stored and/or displayed, as shown in block 1014. The storage of the labeled volume may involve storing the labeled volume in memory and/or the like. The display of the labeled volume may include displaying all or a portion of the labeled volume to a user via a display unit.

As an example, one or more embodiments may include a method of converting data into a subsurface model. The method may include obtaining a data volume associated with a subsurface volume (the data volume has various traces and each trace includes various samples (e.g., data sample)); forming a vector volume from the data volume (each data sample within one or more traces is assigned a vector representing one or more of dip, azimuth and confidence; generating a labeled volume based on the vector volume by propagating labels from at least one initial trace (each of the samples is associated with one of the labels); and one or more of storing the labeled volume in memory accessible by a computer system and displaying the labeled volume on a display accessible by the computer system. The samples may be associated with a single point distributed along an axis of the trace, which may be the y-axis or a depth axis, and each sample may be associated with a seismic attribute or intensity value.

In other embodiments, the method may also include other features. For example, the method may include propagating the labels to at least one trace in the labeled volume based on first order differential equations. Also, the method may include propagating the labels from at least one initial trace may include propagating one label to two or more samples within one traces (e.g., multiple samples within a trace may include similar labels). The method may also include volumes having the same trace distribution (e.g., each sample in a trace has a label and a vector that relate the data volume, vector volume and label volume together) or the volumes may not include the same grid distribution (e.g., the distribution in the vector volume and data volume may be the same for the traces that correspond to each other, but the label volume may have different number of samples in each trace).

In another embodiment, the method to extract a stack of horizon surfaces from a seismic data volume (e.g., 2-D or 3-D) may include obtaining local geometry information in the form of normal vectors; defining labels in one trace; determining how to sample the labels (which labels to follow through); and propagating the labels to adjacent traces to form a boundary of labeled traces. Before propagating labels to adjacent traces, the method may store coordinates for each sampled label of the current trace, propagate labels to adjacent traces; and for each trace that has been processed (e.g., coordinates recorded and all of its adjacent traces populated with labels) discard the labels. Further, the labeled volume, which may be a stack of surfaces, may be compressed during the calculation, which may include applying compression to one trace at a time and/or compression to a neighborhood of traces.

Further, the generating the labeled volume may include selecting one trace within the data volume as the initial trace; assigning labels to the samples within the initial trace; and propagating the labels to samples in other traces based on the assigned labels and the vectors in the initial trace. To propagate these labels, a propagation pattern may be utilized, which may include selecting a propagation pattern before propagating the labels to the samples in the other traces, propagating labels to the samples in the other traces in the orthogonal direction from an inline or cross-line to the initial trace or even in a direction of the tangent plane or tangent vector of the initial trace.

Other embodiments may include managing the distribution of the labels. For instance, the method may include determining whether sufficient coverage of the labeled volume is provided (e.g., are all of the samples provided labels, at least 95% of the samples provided labels or at least 85% of the samples provided labels); if sufficient coverage is provided, one or more of storing the labeled volume in memory accessible by the computer system and displaying the labeled volume on the display accessible by the computer system; and if sufficient coverage is not provided, selecting a second trace of the plurality of traces and assigning the labels to the samples within the second trace and propagating the assigned labels to samples in one or more of the plurality of traces.

In other embodiments, the generating the labeled volume may include combining different label volumes. In particular, the method may include selecting a first trace from the traces within the data volume; assigning first labels to samples within the selected first trace (each sample is associated with one of the first labels); propagating the first labels to samples in other traces based on the assigned first labels, the vectors and a first propagation pattern to create a first labeled volume; and selecting a second trace from the traces within the data volume (e.g., which is different from the first trace); assigning second labels to samples within the selected second trace (each sample is associated with one of the second labels); propagating the second labels to samples in other traces based on the assigned second labels, the vectors and a second propagation pattern; and combining the first labeled volume and the second labeled volume into the labeled volume. The combining the first labeled volume and the second labeled volume may include applying different weights to the first labeled volume and the second labeled volume (e.g., based on confidence or uncertainty in the data or type of data in the data volume). Further, labeled volume may cover different or overlapping portions of the data volume, such as the first labeled volume provides first labels for a first portion of the labeled volume and the second labeled volume provides second labels for a second portion of the labeled volume.

In these embodiments, the propagation patterns may include one of (i) propagating from the selected first trace or selected second trace by following the inline of the trace and then propagating (in parallel) from this initial inline and in the cross-line direction to complete the labeling; and (ii) propagate radially outward starting at the initial trace.

In yet other embodiments, the generating the labeled volume may include selecting one trace within a data volume; selecting one or more labels for a surface location in the data volume; assigning labels to samples within the trace in the data volume; and propagating the labels to other traces in the labeled volume based on the assigned labels for the samples and the vectors, wherein the propagation includes storing in memory the surface location for the selected label and for each trace that has been processed discarding the labels. The label for a sample may be discarded once the coordinates are stored in memory and the adjacent traces are populated with labels.

As may be appreciated, this method may include different data types and be utilized to provide indications as to hydrocarbons within a subsurface region. For example, the method may include traces that are constructed from a seismic image or measured seismic data set); controlled source electromagnetic traces, and/or well log traces. The method may include utilizing the labeled volume to determine the location of hydrocarbons, wherein the labeled volume is created by the method mentioned above. Then, a well may be drilled to access the hydrocarbons and hydrocarbons may be produced from the well.

Figure 11A:
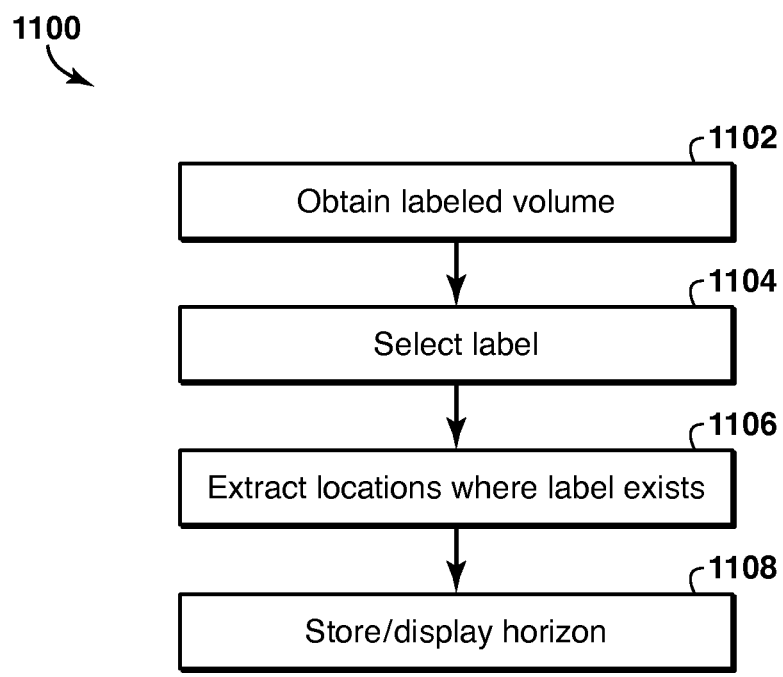
FIGS. 11A and 11B are flow charts for performing the horizon extraction stage in accordance with an exemplary embodiment of the present techniques.
Figure 11B:
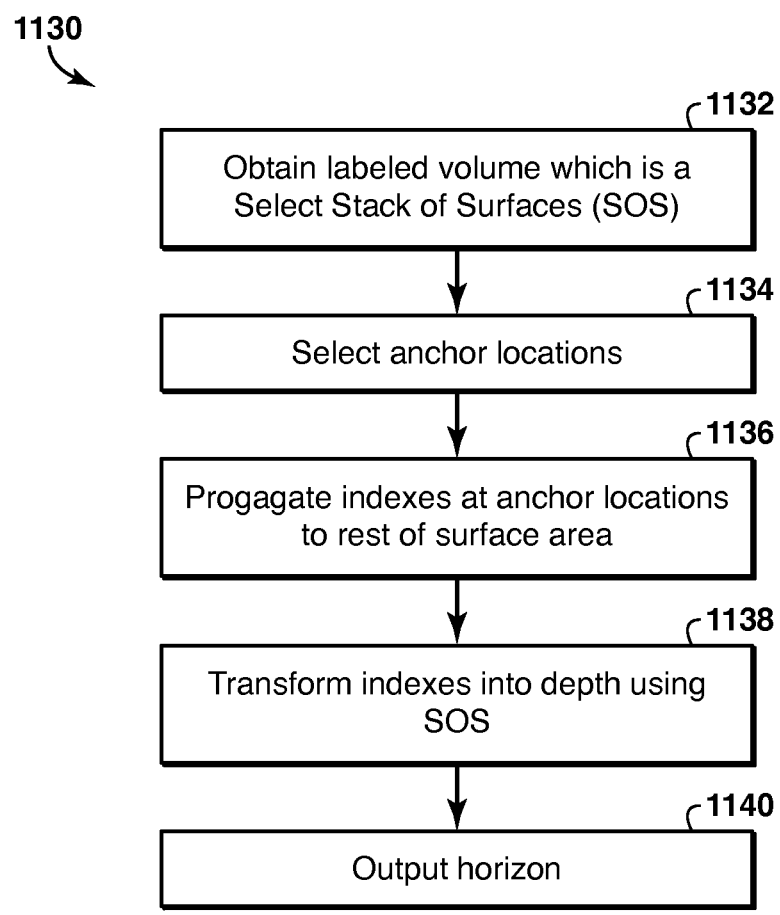

FIGS. 11A and 11B are flow charts for performing the horizon extraction stage in accordance with an exemplary embodiment of the present techniques. These different embodiments may be utilized in the processes noted above, such as horizon extraction stage in block 110 of FIG. 1. In particular, FIG. 11A is a flow chart 1100 that involves selection of one or more labels to determine horizons.

The process begins by obtaining a labeled volume, as shown in block 1102. The labeled volume may be formed from the any of the different label propagation stages noted above. Then, at block 1104, a label within the labeled volume may be selected. This selection may include interacting with a user to select one or more of the labels in the vector volume and/or an automated mechanism (e.g., set of instructions) configured to select certain labels based on certain thresholds. Then, at block 1106, locations where the label exists are extracted. Then, the horizons may be stored and/or displayed, as shown in block 1108. The storage of the horizons may involve storing the horizons in the form of a subsurface model in memory and/or the like. The display of the horizons and/or subsurface model may include displaying all or a portion of the labeled volume to a user via a display unit.

Similar to the flow chart 1100 of FIG. 11A, FIG. 11B is a modified flow chart that may be utilized for a specialized labeled volume, such as a stack of surfaces. That is, this flow chart 1130 includes additional steps utilized to maintain or mange the surface locations.

Similar to the process of FIG. 11A, the process begins by obtaining a labeled volume, which is a stack of surfaces, as shown in block 1132. The labeled volume may be formed from the any of the different label propagation stages noted above, which produce a stack of surfaces. Then, at block 1134, one or more anchor locations may be selected. This selection may include interacting with a user to select one or more of the anchor locations in the labeled volume and/or an automated mechanism (e.g., set of instructions) configured to select certain anchor locations based on certain thresholds. The selection of anchor locations may include assigning index values to the locations. Then, at block 1136, the indices at the anchor locations are propagated to the other traces within the labeled volume. Then, the labeled volume is utilized to transform the indices into depth using the labeled volume, as shown in block 1138. Then, the horizons may be stored and/or displayed, as shown in block 1140. The storage of the horizons may involve storing the horizons in the form of a subsurface model in memory and/or the like. The display of the horizons and/or subsurface model may include displaying all or a portion of the labeled volume to a user via a display unit.

As an example, a method of converting measured data into a subsurface model is described. The method includes obtaining a labeled volume associated with a subsurface volume, wherein the labeled volume has various traces and each of the traces include a different samples, which each are associated with a label; selecting one of the labels or a location associated with one of the labels in the labeled volume; combining the extracted locations into an object associated with the selected label; and one or more of storing the object in memory accessible by a computer system and displaying the object on a display accessible by the computer system. The extracting locations in the labeled volume associated with the selected label include for each sample, comparing the selected label with the label associated with a selected sample in the labeled volume; determining whether the comparison indicates that the label for the selected sample matches (e.g., is substantially the same as) the selected label; if the selected label matches the label associated with the selected sample, assigning the location of the selected label to the selected sample; and if the selected label is not match the label associated with the selected sample, determining an interpolated location for the selected sample and assigning the interpolated location to the selected sample.

As another example, another method of converting measured data into a subsurface model is described. The method may include obtaining a labeled volume associated with a subsurface volume, wherein the labeled volume has a plurality of traces and each of the plurality of traces include a plurality of samples and each sample associated with a surface number; obtaining a surface number perturbation map; selecting a surface number in the labeled volume; extracting locations in the labeled volume associated with the selected surface number; combining the extracted locations into an object associated with the selected surface number; and one or more of storing the object in memory accessible by a computer system and displaying the object on a display accessible by the computer system. The extracting locations in the labeled volume associated with the selected surface number may include: for each sample, comparing the selected surface number with the surface number associated with a selected sample in the labeled volume; determining whether the comparison indicates that the surface number for the selected sample matches the selected surface number; if the selected surface number matches the surface number associated with the selected sample, assigning the location of the selected surface number to the selected sample; and if the selected surface number does not match the surface number associated with the selected sample, determining an interpolated location for the selected sample and assigning the interpolated location to the selected sample.

As yet another embodiment, the method may include a stack of surfaces created from the data volume or even the labeled volume. The method may include obtaining a surface number perturbation map; computing the surface number of the picked point; extracting a surface for each region; reporting the collection of surfaces as the final product (storing or displaying the collection of surfaces). As part of this method, the method may be repeated by modifying the perturbation map and the modifications of the perturbation map may be stored. In certain embodiments, the process may utilize a stack of surfaces to identify horizons from the stack of surfaces. In other embodiments, the method may include multiple stacks of surfaces that are integrated at seams (e.g., seam connections).

In certain embodiments, the method may include certain operations based on the mappings between the volumes. For example, the points (e.g., locations, cells, or samples) in data volume may be selected for a potential horizon is believed to pass through. Then, these points may be converted into indices in the stack of surfaces (e.g., creating values for the points (e.g., point is associated with a location in trace in data volume and depth in trace, which is associated to the index in stack of surfaces). Further, the method may include an array of values for the surface by populating it with the computed values. The values are propagated to the remainder of the samples in the volume following a harmonic interpolation. The array of values represent a trace, all values can be converted into depth or time values by indexing into the stack of surfaces. The indexing may include interpolating indexing.

In other embodiments, the method to extract surfaces from data may include computing an intermediate surface representation, such as a labeled volume, a stack of surfaces, or a multitude of stacks of surfaces. Then, the stack of surfaces may be related to other stack of surfaces. As an example, the method may include selecting a point in the data volume; locating other related points from the surface representation. Further, the method may include a labeled volume and may include obtaining the label of the picked location; extracting other locations in the label volume with the same label. The labeled volume may be the same size as the data volume and each entry has a label and value (e.g., each sample has a value as the label). The method may also include transforming indices into depth via the stack of surfaces.

In certain embodiments, the method may include different features. For example, the method may include selecting one or more anchor locations within the labeled volume and assigning at least one index character at each of the one or more anchor locations; and/or the selection may involve interacting with a user to modify the label volume. Also, the object may be a surface or the location of the selected label may be an integer, and the interpolated location for the selected sample may be indexed by the closest integers to the label of the selected sample. The method may include creating the labeled volume from a data volume, wherein the data volume has a plurality of traces and each of the plurality of traces include a plurality of samples and each sample associated with a data value associated with measured data. Further, the samples in the label volume map to one of the samples in the data volume; the samples in the label volume map to two or more of the samples in the data volume; and/or the label is a surface number. The method may include obtaining a surface number perturbation map prior to selecting one of the labels or a location associated with one of the labels in the labeled volume.

As may be appreciated, this method may include different data types and be utilized to provide indications as to hydrocarbons within a subsurface region. For example, the method may include data volumes that are used to create the label volume. The labeled volume may include traces, such as seismic traces (the seismic traces may be constructed from a seismic image or measured seismic data set); controlled source electromagnetic traces, and/or well log traces. The method may include utilizing the objects to determine the location of hydrocarbons, wherein the object is created by the method mentioned above. Then, a well may be drilled to access the hydrocarbons and hydrocarbons may be produced from the well.

Further, in one or more embodiments, the present techniques may be utilized to produce hydrocarbons from a subsurface region. This subsurface region may be represented by the vector volume, labeled volume and subsurface model, which may be generated in accordance with the embodiments noted above. For example, a method may include constructing a subsurface model via one or more of the various embodiments above. Then, the subsurface model may be utilized in hydrocarbon management activities to determine locations of resources, access the resources and produce hydrocarbons in a manner know to those skilled in the art. Disclosed aspects may be used in hydrocarbon management activities. As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. The term "hydrocarbon management" is also used for the injection or storage of hydrocarbons or $CO_2$, for example the sequestration of $CO_2$, such as reservoir evaluation, development planning, and reservoir management. In one embodiment, the disclosed methodologies and techniques may be used to extract hydrocarbons from a subsurface region. In such an embodiment, inputs are received from a subsurface model or volume of the subsurface region, where the geologic model has been improved using the methods and aspects disclosed herein. Based at least in part on the subsurface model or volumes, the presence and/or location of hydrocarbons in the subsurface region is predicted. Hydrocarbon extraction may then be conducted to remove hydrocarbons from the subsurface region, which may be accomplished by drilling a well using oil drilling equipment. The equipment and techniques used to drill a well and/or extract the hydrocarbons are well known by those skilled in the relevant art. Other hydrocarbon extraction activities and, more generally, other hydrocarbon management activities, may be performed according to known principles.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present invention is in no way limited to implementation in any specific operating system or environment.

As an example, a computer system may be utilized and configured to implement on or more of the present aspects. The computer system may include a processor; memory in communication with the processor; and a set of instructions stored on the memory and accessible by the processor, wherein the set of instructions, when executed, are configured to: (i) obtain a data volume associated with one or more geophysical properties, (ii) compute one or more vectors from the data volume as part of the a vector estimation stage; (iii) propagate one or more labels based on a trace in the data volume and the vector volume as part of a label propagation stage; (iv) extract a horizon at the locations where a given label occurs to form a subsurface model (e.g., the horizon is represented as an iso-surface of the labeled volume) as part of a horizon extraction stage; and display and/or store the resulting the subsurface model. The set of instructions should also include selection of multiple horizons to be determined in the horizon extraction stage, wherein each may be associated with one or more labels. The set of instructions in the different stages may include displaying instructions to a user and receiving indications from the user for the selection of the trace and/or the selection of one or more labels. Accordingly, the horizon extraction stage may preferably be extracted by selecting a point of interest in the data and reading the label at that m location.

Further, should the initial estimate of the horizons be inadequate in the subsurface model, edits may be performed. In one embodiment, the set of instructions that perform the edits may include a correction operation that modifies the initial vector field. That is, the set of instructions may include steps, such as flattening the data volume based on a labeled volume, computing an error estimate from the flattened volume; forming vector error estimates into an vector error volume; determining if the error estimates are within a threshold; and based on the determination regarding the error estimates, updating the vector volume and/or providing an indication that the vector volume is sufficient (e.g., within the desired threshold). Following these steps, the set of instructions may involve propagating labels as part of the label propagation stage based on the updated vector volume, wherein the labels may be selected from the previously selected locations, and the horizons may be computed, as described above.

In another embodiment, the set of instructions may perform edits by directly modifying the labeled volume. That is, the set of instructions may modify the labeled volume in locations and/or neighborhoods of anticipated horizons, which may be indicated by calculating the iso-surfaces of the labeled volume. The set of instructions may be configured to modify simultaneously the surfaces that pass through that location and/or neighborhood.

Further, one or more embodiments may include a system for converting data into a subsurface model that comprises a processor; a tangible, non-transitory machine-readable storage medium (e.g., memory) that stores a set of instructions for execution by the processor. The set of instructions, when executed by the processor, are configured to: obtain a labeled volume associated with a subsurface volume, wherein the labeled volume has a plurality of traces and each of the plurality of traces include a plurality of samples and each sample associated with a label; select one of the labels or a location associated with one of the labels in the labeled volume; extract locations in the labeled volume associated with the selected label; combine the extracted locations into an object associated with the selected label; and provide access to one or more of store the object in memory accessible by the processor and display the object on a display. The extract locations in the labeled volume associated with the selected label may include for each sample, compare the selected label with the label associated with a selected sample in the labeled volume; determine whether the comparison indicates that the label for the selected sample matches the selected label; if the selected label matches the label associated with the selected sample, assign the location of the selected label to the selected sample; and if the selected label is not match the label associated with the selected sample, determine an interpolated location for the selected sample and assign the interpolated location to the selected sample.

Further, one or more embodiments may include other instructions for enhancing the process. For example, the set of instructions may be further configured to select one or more anchor locations within the labeled volume; and assign at least one index character at each of the one or more anchor locations. The object may be a surface and the location of the selected label may be an integer, and the interpolated location for the selected sample may be indexed by the closest integers to the label of the selected sample. The set of instructions are further configured to create the labeled volume from a data volume, wherein the data volume has traces and each traces include samples and each sample associated with a data value associated with measured data. Also, the samples in the label volume may map to one of the samples in the data volume; the label may be a surface number; and/or the samples in the label volume may map to two or more of the samples in the data volume. The set of instructions may be further configured to interact with a user to modify the label volume. Further, the set of instructions are further configured to obtain a surface number perturbation map prior to the selection of one of the labels or a location associated with one of the labels in the labeled volume.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. The articles "the", "a" and "an" are not necessarily limited to mean only one, but rather are inclusive and open ended so as to include, optionally, multiple such elements.

The invention claimed is:

1. A method of converting measured data into a subsurface model comprising:
    obtaining a labeled volume associated with a subsurface volume, wherein the labeled volume has a plurality of traces and each of the plurality of traces include a plurality of samples and each sample is associated with a surface number;
    obtaining a surface number perturbation map;
    selecting a surface number in the labeled volume;
    extracting locations in the labeled volume associated with the selected surface number, comprising:
        for each sample in the labeled volume, referred to as the selected sample, adjusting the selected surface number associated with the selected sample in the labeled volume based on the surface number perturbation map;
        adjusting the selected surface number based on the surface number perturbation map and comparing it to the adjusted surface number associated with the selected sample;
        determining whether the comparison indicates that the adjusted surface number for the selected sample matches the adjusted selected surface number;
        if the adjusted selected surface number matches the adjusted surface number associated with the selected sample, extracting the location of the selected sample;
        if the adjusted selected surface number does not match the adjusted surface number associated with any sample of a trace, then determining an interpolated location for the selected surface number between neighboring samples with closest surface number values and extracting the interpolated location;
    combining locations extracted in the extracting locations in the labeled volume step into an object associated with the selected surface number;
    wherein the selecting, extracting, and combining are performed using a computer;
    one or more of storing the object in memory accessible by a computer system and displaying the object on a display accessible by the computer system;
        upon associating the object with hydrocarbons, drilling a well to access the hydrocarbons; and
        producing the hydrocarbons from the well.

2. The method of claim 1, further comprising selecting one or more anchor locations within the labeled volume; and assigning at least one index character at each of the one or more anchor locations.

3. The method of claim 1, wherein the object is a surface.

4. The method of claim 1, wherein the location of the selected sample is an integer and the interpolated location for the selected sample is indexed by the closest integers to the label of the selected sample.

5. The method of claim 1, further comprising creating the labeled volume from a data volume, wherein the data volume has a plurality of traces and each of the plurality of traces include a plurality of samples and each sample is associated with a data value associated with measured data.

6. The method of claim 5, wherein the samples in the labeled volume map correspond to one or more of the samples in the data volume.

7. The method of claim 5, wherein the selecting is based on the entry of a user interacting with the labeled volume.

* * * * *